US012800478B2

(12) United States Patent
Weissler et al.

(10) Patent No.: US 12,800,478 B2
(45) **Date of Patent: *Nov. 17, 2026**

(54) CRYSTALLOGRAPHIC DEFECT INSPECTION

(71) Applicant: Camtek Ltd., Migdal Ha'emek (IL)

(72) Inventors: Yuval Weissler, Kibutz Ha'Zorea (IL); Yossi Mangisto, Haifa (IL)

(73) Assignee: Camtek Ltd., Migdal Ha'emek (IL)

( * ) Notice: Subject to any disclaimer, the term of this patent is extended or adjusted under 35 U.S.C. 154(b) by 67 days.

This patent is subject to a terminal disclaimer.

(21) Appl. No.: 19/094,066

(22) Filed: Mar. 28, 2025

(65) Prior Publication Data

US 2025/0305967 A1 Oct. 2, 2025

Related U.S. Application Data

(60) Provisional application No. 63/571,148, filed on Mar. 28, 2024.

(51) Int. Cl.

| | |
|---|---|
| ***G01N 21/21*** | (2006.01) |
| ***G01N 21/23*** | (2006.01) |
| ***G01N 21/88*** | (2006.01) |
| ***G01N 21/95*** | (2006.01) |
| ***H10P 72/76*** | (2026.01) |

(52) U.S. Cl.

CPC ............. *G01N 21/21* (2013.01); *G01N 21/23* (2013.01); *G01N 21/8806* (2013.01); *G01N 21/9505* (2013.01); *H10P 72/7624* (2026.01); *G01N 2021/8848* (2013.01); *G01N 2201/068* (2013.01)

(58) Field of Classification Search

CPC .... G01N 21/21; G01N 21/23; G01N 21/8806; G01N 21/9505; G01N 2021/8848; G01N 2201/068; H10P 72/7624; G01B 9/02018

See application file for complete search history.

(56) References Cited

U.S. PATENT DOCUMENTS

| | | | | |
|---|---|---|---|---|
| 6,086,453 | A | 7/2000 | Fukuoka et al. | |
| 6,824,056 | B1 | 11/2004 | Karin | |
| 7,144,056 | B2 * | 12/2006 | Casarotti | H10P 72/0606 414/800 |

(Continued)

FOREIGN PATENT DOCUMENTS

| | | | |
|---|---|---|---|
| CN | 115219517 | A | 10/2022 |
| CN | 115356265 | A | 11/2022 |

OTHER PUBLICATIONS

Ouisse et al. Micropipe-induced birefringence in 6H silicon carbide. Journal of Applied Crystallography, 2010, 43, pp. 122-133. • 10.1107/s0021889809043957• .

*Primary Examiner* — Kara E. Geisel
*Assistant Examiner* — Christina I Xing
(74) *Attorney, Agent, or Firm* — Smith Baluch LLP

(57) ABSTRACT

A wafer inspection system employing reflected bright-field microscopy can be adapted with polarizing optics and a mirror to detect polarization-altering defects (such as micropipes) in semiconductor wafers. The polarization-altering defects can be located within the bulk of the semiconductor wafer and can be imaged as bright features on a darker background. The system can also be used for conventional bright-field inspection of non-polarization-altering defects such as contaminants and inclusions.

29 Claims, 12 Drawing Sheets

(56) References Cited

U.S. PATENT DOCUMENTS

| | | | | |
|---|---|---|---|---|
| 7,201,799 | B1 | 4/2007 | Velidandla | |
| 7,220,978 | B2 | 5/2007 | Ma et al. | |
| 7,592,616 | B1 | 9/2009 | Velidandla | |
| 8,035,822 | B2 | 10/2011 | Riza et al. | |
| 8,233,699 | B2 | 7/2012 | Postolov et al. | |
| 8,281,674 | B2 | 10/2012 | Nisany et al. | |
| 8,319,978 | B2 | 11/2012 | Ben-Levi et al. | |
| 8,741,413 | B2 | 6/2014 | Zwieback et al. | |
| 9,291,576 | B2 | 3/2016 | Pacheco et al. | |
| 9,551,672 | B2 | 1/2017 | Seki et al. | |
| RE46,315 | E | 2/2017 | Zwieback et al. | |
| 9,754,812 | B2 | 9/2017 | Ben-Natan | |
| 9,874,526 | B2 | 1/2018 | Liu et al. | |
| 10,119,920 | B2 | 11/2018 | Mizutani et al. | |
| 11,035,054 | B2 | 6/2021 | Xu et al. | |
| 11,361,454 | B2 | 6/2022 | Leonard et al. | |
| 12,292,374 | B1 * | 5/2025 | Weissler | G01N 21/21 |
| 2002/0134952 | A1 * | 9/2002 | Ishii | G01D 5/342 250/559.26 |
| 2004/0206891 | A1 | 10/2004 | Ma et al. | |
| 2005/0094136 | A1 | 5/2005 | Xu et al. | |
| 2008/0297808 | A1 | 12/2008 | Riza et al. | |
| 2010/0117279 | A1 | 5/2010 | Vekstein et al. | |
| 2010/0128284 | A1 | 5/2010 | Riza et al. | |
| 2011/0242312 | A1 | 10/2011 | Seki et al. | |
| 2012/0087774 | A1 * | 4/2012 | Vekstein | H10P 72/0442 269/21 |
| 2013/0280466 | A1 | 10/2013 | Zwieback et al. | |
| 2015/0168311 | A1 | 6/2015 | Seki et al. | |
| 2017/0321345 | A1 | 11/2017 | Xu et al. | |
| 2018/0195952 | A1 | 7/2018 | Mizutani et al. | |
| 2019/0170655 | A1 | 6/2019 | Smith | |
| 2019/0323145 | A1 | 10/2019 | Xu et al. | |
| 2020/0132608 | A1 * | 4/2020 | Chu | G01N 21/8806 |
| 2020/0365685 | A1 | 11/2020 | Leonard et al. | |
| 2021/0189591 | A1 | 6/2021 | Xu et al. | |
| 2021/0272298 | A1 | 9/2021 | Leonard et al. | |
| 2021/0333719 | A1 * | 10/2021 | Kapoano | G01N 21/8806 |
| 2022/0381556 | A1 | 12/2022 | Yacoubian | |

* cited by examiner

CRYSTALLOGRAPHIC DEFECT INSPECTION

CROSS-REFERENCE TO RELATED APPLICATION(S)

This application claims the priority benefit, under 35 U.S.C. 119 (e), of U.S. Application No. 63/571,148, filed on Mar. 28, 2024, which is incorporated herein by reference in its entirety for all purposes.

BACKGROUND

Silicon carbide (SiC) is a type of semiconductor monocrystal which has excellent thermal conductivity properties, high saturation electron mobility, and high voltage breakdown resistance. It is suitable for preparing high frequency, high power, high temperature, and radiation-resistant electronic devices. During the production of SiC wafers for semiconductor applications, the crystal undergoes internal and external stresses, causing growth of defects, or dislocations, within the atomic lattice. One such defect is called a micropipe defect.

A micropipe, also called a micropore, microtube, capillary defect or pinhole defect, is a crystallographic defect in a single crystal substrate. Another type of defect, called screw dislocation, is a common dislocation that transforms successive atomic planes within a crystal lattice into the shape of a helix. Once a screw dislocation propagates through the bulk of a sample during the wafer growth process, a micropipe can be formed. Micropipes are often regarded as a "killer defects," and the presence of a high density of micropipes within SiC wafer, for example, can result in a significant loss of device yield in a device manufacturing process that uses the SiC wafer.

SUMMARY

Described herein are apparatus and methods to image micropipe and other polarization-altering defects in semiconductor wafers. According to some implementations, one or more polarizers and a mirror can be added to a bright-field microscope to convert the microscope into an inspection tool to detect polarization-altering defects. For example, a first polarizer can prepare radiation incident on a semiconductor wafer in a first polarization state (e.g., circularly polarized radiation). The radiation in the first polarization state can pass through the semiconductor wafer and be reflected back by the mirror and through the wafer again. A polarization-altering defect in the semiconductor wafer can locally change the polarization of the radiation by a different amount than defect-free areas of the semiconductor wafer as the radiation passes through the semiconductor wafer. Radiation that has been reflected back through the semiconductor wafer can be analyzed by the first polarizer or a second polarizer to detect the presences of polarization-altering defects in a field of view of the microscope.

Some implementations relate to systems for detecting a polarization-altering defect in a semiconductor wafer. Such systems can comprise: an illumination source to emit radiation; an objective lens to focus the radiation from the illumination source onto the semiconductor wafer; a mirror arranged to reflect the radiation that emerges from the semiconductor wafer back through the semiconductor wafer as reflected radiation; an imaging array to record an image of at least part of the semiconductor wafer produced by at least a portion of the reflected radiation that passes back through the semiconductor wafer; and a linear polarizer located between the semiconductor wafer and the imaging array. The linear polarizer can be oriented to: block a first portion of the reflected radiation that travels through a first region of the semiconductor wafer that does not include the polarization-altering defect; and transmit at least part of a second portion of the reflected radiation that travels through a second region of the semiconductor wafer that includes the polarization-altering defect.

Some implementations relate to methods of detecting a polarization-altering defect in a semiconductor wafer. Such methods can comprise acts of: illuminating, with radiation from an illumination source, an area of a semiconductor wafer with the radiation in a first polarization state; reflecting, with a mirror, the radiation that has passed through the semiconductor wafer back towards the semiconductor wafer as reflected radiation; collecting, with an objective lens, a portion of the reflected radiation to form an image of the area of the semiconductor wafer; blocking, with a linear polarizer, a first portion of the reflected radiation that travels through a first region within the area of the semiconductor wafer that does not include the polarization-altering defect; transmitting, with the linear polarizer, at least part of a second portion of the reflected radiation that travels through a second region within the area of the semiconductor wafer that includes the polarization-altering defect; and detecting, with an imaging array, an image of the area of the semiconductor wafer produced by at least the part of the second portion of the reflected radiation that is transmitted by the linear polarizer.

Some implementations relate to kits to convert a wafer inspection system into a system to detect polarization-altering defects in a semiconductor wafer. Such kits can comprise: at least one linear polarizer to mount in a forward optical path of the wafer inspection system, the forward optical path extending between an illumination source and the semiconductor wafer, wherein the illumination source is arranged to illuminate an area of the semiconductor wafer for inspection of the semiconductor wafer; at least one wave plate to mount in the forward optical path between the linear polarizer and the semiconductor wafer; and a mirror to mount in the wafer inspection system at a location such that radiation from the illumination source that travels along the forward optical path and passes through the semiconductor wafer reflects from the mirror back through the semiconductor wafer and towards an objective lens of the wafer inspection system.

Some implementations relate to methods of detecting a polarization-altering defect in a semiconductor wafer with a kit that adapts a wafer inspection system into a system to detect polarization-altering defects in the semiconductor wafer. Such methods can comprise acts of: mounting a linear polarizer in a forward optical path of the wafer inspection system, the forward optical path extending between an illumination source and the semiconductor wafer, wherein the illumination source is arranged to illuminate the semiconductor wafer for inspection of the semiconductor wafer; mounting a wave plate in the forward optical path between the linear polarizer and the semiconductor wafer; and mounting a mirror in the wafer inspection system at a location such that radiation from the illumination source that travels along the forward optical path and passes through the semiconductor wafer reflects from the mirror back through the semiconductor wafer and towards an objective lens of the wafer inspection system.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Semiconductor wafers are often inspected for defects in order to control the yield of processes incorporating such wafers. The most typical method of inspecting semiconductor wafers for defects is using reflected bright-field microscopy (e.g., using a microscope system with coaxial illumination). In reflected bright-field microscopy, defects and contaminants in or on a wafer usually manifest as dark spots on an otherwise brighter background. In the bulk of a semiconductor wafers, defects such as micropipes or slip lines are difficult, if not impossible, to distinguish from other types of defects (such as inclusions, pinholes, and contaminants) that may be present in the wafer when inspected with typical reflected bright-field microscopy, as all of the above defects and contaminants manifest as dark spots with no obvious difference between them in the observed image.

The inventors have recognized and appreciated that the capability to optically detect polarization-altering defects (such as micropipes) in a wafer inspection system (such as a microscope or wafer inspection tool) can be a valuable functionality when inspecting semiconductor wafers, such as SiC wafers. As described above, SiC wafers are susceptible to formation of micropipe defects during manufacture. Being able to detect and discern these defects from other types of defects and contaminants can improve device yield in a manufacturing facility by rejecting SiC wafers with micropipe defect densities above a threshold level. Additionally, wafers that might otherwise be rejected because of an inability to discern micropipe defects from surface contaminants, for example, with conventional bright-field microscopy can be cleaned and used rather than wasted. Other semiconductor wafers that could be inspected for polarization-altering defects and benefit from apparatus described herein include, but are not limited to, gallium arsenide (GaAs), gallium nitride (GaN), silicon (Si), silicon germanium (SiGe), indium phosphide (InP), and gallium phosphide (GaP).

1. OVERVIEW OF WAFER INSPECTION TOOLS

Figure 1:
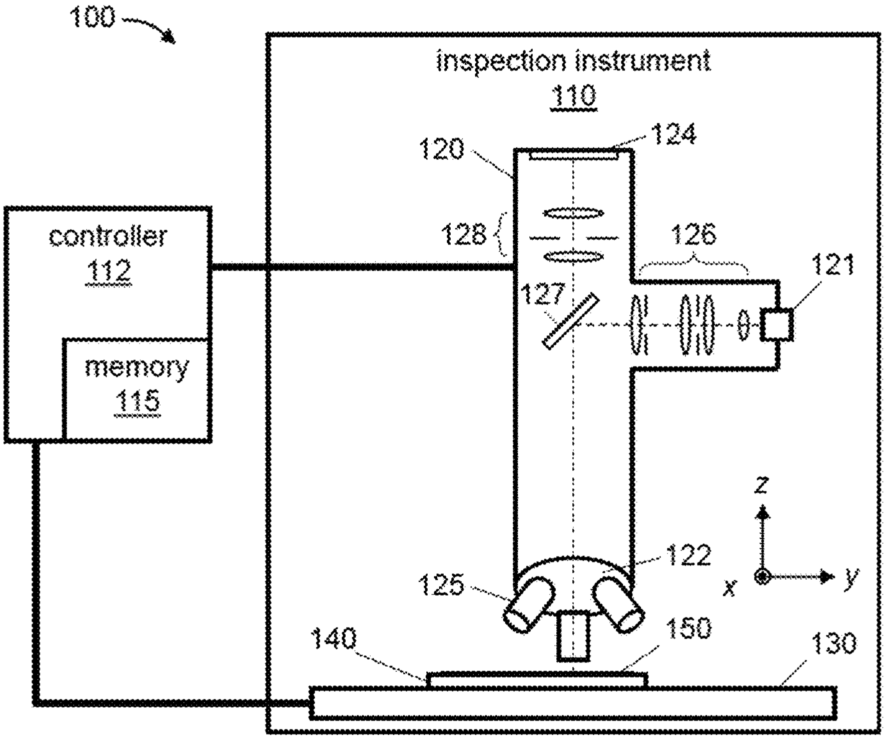
FIG. 1 depicts an example wafer inspection system in which apparatus for inspecting polarization-altering defects can be installed.

The inventors have devised a way to convert wafer inspection systems having optics for bright-field microscopy into wafer inspection systems that can detect micropipe and other polarization-altering defects in or on a semiconductor wafer in addition to detecting other defects or contaminants by conventional bright-field microscopy. FIG. 1 depicts an example of a wafer inspection system 100 that can detect defects and contaminants by conventional, reflected bright-field microscopy and can further be adapted to detect micropipe and other polarization-altering defects in or on a semiconductor wafer. The adaptation of the system can further enable the detection of contaminants (such as carbon inclusions) within the bulk of the semiconductor wafer 150.

The example wafer inspection system 100 of FIG. 1 comprises an inspection instrument 110 that includes an inspection head 120, a wafer chuck 140 to hold a semiconductor wafer 150, and a positioning stage 130. The inspection head 120 (which may be referred to as an "inspection microscope") further comprises optics and electronics for illuminating the semiconductor wafer 150 and for obtaining microscopic images of features in and on the semiconductor wafer 150. For example, the inspection head 120 can comprise at least one objective lens 125 on a rotatable head 122, imaging optics 128, and an imaging array 124 (e.g., a CMOS or CCD imager) to obtain and record different magnified images of features in and on the semiconductor wafer 150. The inspection head 120 can further comprise an illumination source 121, a beamsplitter 127, and illumination optics 126 to provide illumination radiation incident on the semiconductor wafer 150. The radiation from the illumination source 121 can be folded onto the imaging optical path (running vertically in FIG. 1) with the beamsplitter 127. The inspection head can form bright-field microscopic images of features on the surface of a semiconductor wafer 150 or within the bulk of the semiconductor wafer 150 when an illumination radiation wavelength is selected that transmits through the semiconductor wafer 150.

The illumination source 121 can be broadband (e.g., white light from a halogen bulb or bright LED adapted to emit white light). In some cases, the illumination source 121 can comprise one or more narrow band sources (e.g., narrow band LEDs). A broadband illumination source 121 can emit radiation within a bandwidth of wavelengths spanning at least 100 nm to 200 nm or larger (e.g., emitting wavelengths simultaneously from 450 nm to 550 nm). A narrow band illumination source 121 can emit radiation within a bandwidth of wavelengths no broader than 90 nm in some cases, no broader than 50 nm in some cases, or even no broader than 20 nm in some cases. Radiation from illumination sources 121 used in the inspection head 120 can have wavelengths from approximately or exactly 400 nm to approximately or exactly 10 microns, in some cases, or any subrange therebetween. For SiC wafers, the illumination source 121 can emit radiation having wavelengths in a band between 500 nm and 1.5 μm. For Si wafers, the illumination source 121 can emit radiation having wavelengths in a band between 1.5 μm and 5 μm. In some cases, the illumination source 121 can emit radiation having wavelengths in a band between 350 nm and 400 nm (near-ultraviolet wavelengths). In other cases, the illumination source 121 can emit radiation having wavelengths in a band between 400 nm and 700 nm (visible wavelengths). In still other cases, the illumination source 121 can emit radiation having wavelengths in a band between 700 nm and 3000 nm (near-infrared and short-wavelength infrared wavelengths). In some implementations at longer wavelengths, image acquisition may be based on passive illumination (e.g., thermal radiation emitted from an object).

In some implementations, multiple illumination sources 121 emitting at different wavelength bands can be installed in the inspection head 120 and rotated or moved into position under control of the controller 112 to provide radiation for inspecting the semiconductor wafer 150. For example, a first illumination source 121 may emit radiation that is reflected from the surface of the semiconductor wafer 150 and that does not propagate through the semiconductor wafer 150. This first illumination source 121 can be used to inspect the wafer for surface defects and/or contaminants via reflected bright-field microscopy. A second illumination source 121 may emit radiation that can propagate through the semiconductor wafer 150. The second illumination source 121 can be used to detect defects and/or contaminants in the bulk of the semiconductor wafer 150 by bright-field microscopy and additionally or alternatively by polarization-sensitive microscopy described further below.

The wafer chuck 140 and semiconductor wafer 150 can be positioned in two dimensions (e.g., x and y directions indicated in FIG. 1) by the positioning stage 130 to inspect different areas of the semiconductor wafer 150. In some implementations, the positioning stage 130 is driven to scan the semiconductor wafer in x and y directions, such that at least a plurality of small regions across most of the wafer surface (e.g., 90% of the surface or more) can be imaged and analyzed to evaluate the suitability of the wafer for semiconductor processing. For example, a plurality of sample images (each the size of the inspection head's field of view) can be taken at random locations across the semiconductor wafer 150, and an average defect density can be computed for the wafer to determine whether or not the wafer should be rejected from semiconductor processing. The wafer chuck 140 can be sized to hold large semiconductor wafers (e.g., 150-mm-diameter wafers, 200-mm-diameter wafers, 300-mm-diameter wafers, and even larger wafers).

According to some implementations, the inspection head 120 can be moved vertically (+z direction) to adjust focus of the inspected area for the imaging optics. In some implementations, automatic focusing is implemented by the controller 112 based on analysis of images obtained by the imaging array 124. Automatic focusing can be used to compensate for bow or warp in the semiconductor wafers 150 during wafer inspection. For example, automatic focusing can track height variations of up to 200 microns in the semiconductor wafer 150 due to bow or warp as the wafer is moved laterally under the inspection head 120. The wafer inspection system 100 may be marketed as a wafer inspection tool for a semiconductor manufacturing facility or a semiconductor foundry. In some cases, the wafer inspection system 100 can be implemented as a table-top microscope.

The inspection instrument 110, or some components thereof, can be manually operated in some cases (e.g., as done in a conventional manually-operated microscope) or can be automated under the control of the controller 112. When automated, the positioning stage 130 comprises one or more actuators (e.g., stepper motors, piezoelectric positioners, etc.) configured to move the wafer chuck 140 in at least two dimensions in response to control signals issued by the controller 112. Changing of objective lenses 125 can also be automated by the controller 112 (e.g., by commanding a rotation of the rotatable head 122). Autofocusing of the inspection head 120 can also be controlled by the controller 112. Other aspects that can be controlled by the controller 112 include, but are not limited to, selection and brightness of the illumination source 121, settings of optical stops in the illumination optics 126 and the imaging optics 128, selection of optical filters, and orientations of polarization optics (which are described below in connection with imaging polarization-altering defects).

The controller 112 can be communicatively coupled to at least the positioning stage 130 and may further be communicatively coupled to the inspection head 120. The controller 112 can be adapted with machine-readable instructions (which can be stored in memory 115) to operate the wafer inspection system 100. In some cases, the controller 112 can control the inspection head 120 to obtain digital images of different areas of the semiconductor wafer 150 as the wafer 150 is moved to different positions by the positioning stage 130.

The controller 112 can be implemented in different ways. In one example, the controller 112 comprises a microprocessor. However, the controller 112 can comprise a combination of components selected from the following list: a microprocessor, a microcontroller, a programmable logic unit (PLU), a field-programmable gate array (FPGA), an application specific integrated circuit (ASIC), a digital signal processor (DSP), and a digital logic chip. There can be one, none, or more than one component of a particular type from the list in the combination (e.g., one PLU and three FPGAs).

Figure 2:
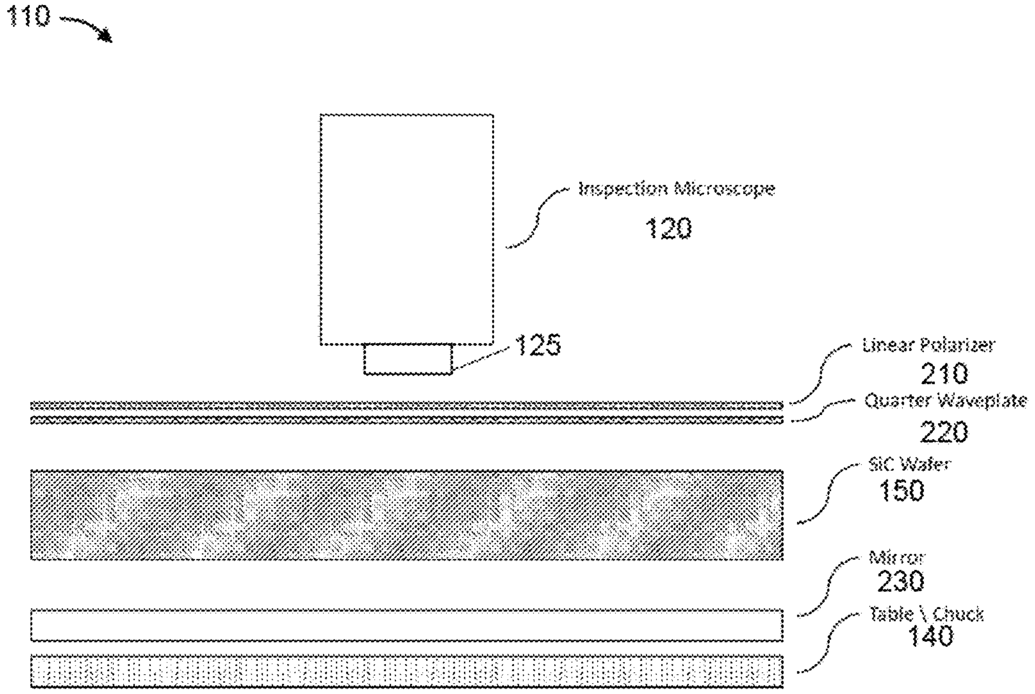
FIG. 2 depicts one example arrangement of optics to adapt a wafer inspection system (such as the system of FIG. 1) to an apparatus that can also detect polarization-altering defects.

FIG. 2 depicts one way in which the wafer inspection system 100 of FIG. 1 can be adapted with optical components to detect polarization-altering defects in or on a semiconductor wafer 150. The illustration is for a SiC wafer, but the optical arrangement will work for other types of semiconductor wafers 150.

To adapt a wafer inspection system 100, several optical components can be added to the inspection head 120 as depicted in FIG. 2. In the illustrated example, a linear polarizer 210 and a waveplate 220, such as a quarter-wave plate or custom wave plate are placed between the inspection head 120 and the semiconductor wafer 150 (e.g., between the objective lens 125 and the semiconductor wafer 150). Additionally, a mirror 230 is placed beyond an opposite side (or back surface) of the semiconductor wafer 150 that faces away from the inspection head 120, such that radiation from an illumination source 121 in the inspection head 120 passes through the semiconductor wafer 150 and is reflected back by the mirror 230 to travel back through the semiconductor wafer 150 and back to the inspection head 120. The returning radiation will pass again through the quarter-wave plate 220 and linear polarizer 210 before reaching the inspection head 120 and imaging array 124 for image recording.

The linear polarizer 210 can be an absorptive polarizer (transmitting light linearly polarized along the polarizer's polarization axis and absorbing light that is not polarized along this axis). Such a polarizer can be made from stretched polyvinyl alcohol (PVA), for example. Other polarizers can also be used for producing linearly polarized light, such as polarizing beamsplitters, reflective polarizers, and double-refractive (birefringent) polarizers. An example linear polarizer is a high-performance glass linear polarizer (e.g., item 47-216) available from Edmund Optics of Barrington, New Jersey.

The quarter-wave plate 220 can be formed from a birefringent material (e.g., from a birefringent crystal such as calcite or from a birefringent polymer film) having a thickness selected for the wavelength of light for which the quarter-wave plate is designed. The thickness is selected such that one linear polarization component is retarded by 90 degrees in phase with respect to the second orthogonal linear polarization component of radiation at the design wavelength when the radiation passes through the quarter-wave plate. The quarter-wave plate can be a multi-order quarter-wave plate, a zero-order quarter-wave plate, or a pseudo-true zero-order quarter-wave plate. An example quarter-wave plate is a pseudo-true zero-order quarter-wave plate (e.g., item WPQ10M-633) available from Thorlabs of Newton, New Jersey.

The mirror 230 is preferably of adequate optical quality and large in size. The flatness of the mirror can be less than one wavelength deviation over the area of the mirror. The diameter of the mirror can be up to 150 mm in some cases, up to 200 mm in some cases, and even up to 300 mm in some cases. The mirror 230 can be a coated metallic reflective mirror or a multi-layer dielectric mirror. In some implementations, the mirror 230 comprises a semiconductor wafer that has been coated for high reflectivity (e.g., at least 85% reflectivity for the radiation from the illumination source 121. The coated wafer can be chucked to a flat chuck surface in the wafer chuck 140 to provide a flat reflective surface for the mirror 230.

In some implementations, the mirror 230 can be smaller in diameter or area than the semiconductor wafer 150. In such implementations, the semiconductor wafer 150 can be moved (e.g., shifted and/or rotated) with respect to the mirror 230 so that the entire area of the semiconductor wafer 150 can be inspected.

The adapted system of FIG. 2 operates appreciably differently from a conventional bright-field microscope. For a conventional bright-field microscope, radiation from the inspection head 120 would typically be focused by the objective lens 125 onto the near side (sometimes referred to as the front surface or process surface) of the semiconductor wafer 150 facing the inspection head and be reflected from the front surface back to the inspection head 120 for imaging and image recording. A defect, such a contaminant on the surface of the semiconductor wafer 150 would scatter radiation out of the collection angle of the objective lens 125 and thus appear as a dark feature on a brighter background.

Figure 3:
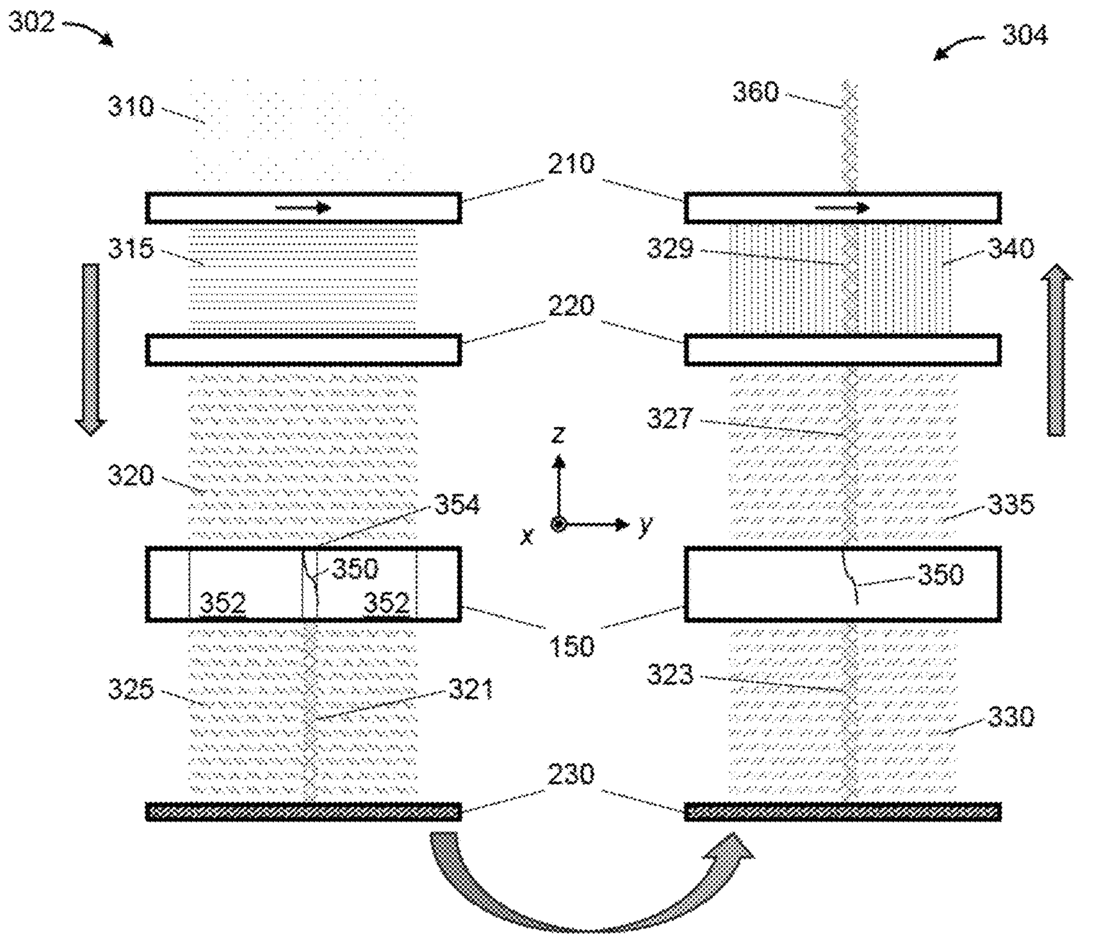
FIG. 3 illustrates how the adapted wafer inspection system of FIG. 2 can detect polarization-altering defects (such as micropipes) in a semiconductor wafer.

By adding the linear polarizer 210, quarter-wave plate 220, and mirror 230 as depicted in FIG. 2, and further by using radiation that can transmit twice through the semiconductor wafer 150 with enough transmission for detection of an image, polarization-altering defects such as micropipes in, at, or extending to the surface of the semiconductor wafer 150 can be detected. FIG. 3 illustrates how the defects can be detected.

2. POLARIZATION-SENSITIVE DETECTION OF POLARIZATION-ALTERING DEFECTS

The drawing in FIG. 3 is simplified for the purpose of explaining polarization-sensitive detection of the polarization-altering defects. The drawing does not show focusing by the objective lens 125 which occurs in an implemented wafer inspection system 100. The drawing also separates the forward optical path 302 (left side of drawing) and reflected optical path 304 (right side of drawing), which paths may or may not be separated in an implemented wafer inspection system 100. For the example system of FIG. 2, the forward optical path 302 and reflected optical path 304 spatially overlap, at least in part. In this example, the forward optical path 302 is colinear with the reflected optical path 304 through the polarizing components and semiconductor wafer 150 and separated elsewhere in the inspection head 120. In some implementations, the forward optical path 302 may be incident on the mirror 230 at an angle greater than 0 degrees with respect to a normal direction to the mirror's surface, such that the reflected optical path 304 is oriented at a non-zero angle with respect to the forward optical path 302. As used herein, an optical path is defined by a central axis of an optical beam as the optical beam travels through the inspection instrument 110.

A wafer inspection system 100 adapted with optical components as illustrated in FIG. 3 can detect polarization-altering defects 350 as follows. Radiation 310 from a source is incident on the linear polarizer 210 to prepare the radiation 310 in a first polarization state 315. The first radiation can be selected to have a wavelength or range of wavelengths that transmit through the semiconductor wafer 150 with high transmission (e.g., at least 60% transmission). The radiation 310 may or may not be polarized. The radiation 310 before the linear polarizer 210 may be referred to as "first radiation" and the radiation after the linear polarizer 210 may be referred to as "second radiation" since it may be in a different polarization state than the first radiation 310.

Radiation in the first polarization state 315 can pass through the quarter-wave plate 220 and be converted to a second polarization state 320. The second polarization state 320 may be circular or elliptical, for example, depending on the orientation of the linear polarizer 210 with respect to the quarter-wave plate 220. When the polarization axis of the linear polarizer 210 is oriented 45 degrees from the fast axis of the quarter-wave plate 220, the second polarization state 320 is right-handed or left-handed circular polarization. Radiation in the second polarization state 320 may be referred to as second radiation.

Radiation in the second polarization state 320 can then pass through the semiconductor wafer 150 and emerge as radiation in a third polarization state 325 for regions 352 of the semiconductor wafer 150 that are free of polarization-altering defects 350. Radiation in the third polarization state 325 may be referred to as third radiation. The third polarization state 325 may be different from the second polarization state 320 (e.g., if the semiconductor wafer 150 has some birefringence), or may be the same as the second polarization state 320.

Radiation that passes through a region 354 of the semiconductor wafer 150 containing a polarization-altering defect 350 and that interacts with the polarization-altering defect 350 can have its polarization changed to a fourth polarization state 321 that is different from the third polarization state 325. For example, the third polarization state 325 may be right circular polarization and the fourth polarization state 321 may be right elliptical polarization. Other polarization states are possible for these two different polarization states. Generally, the polarization-altering defect 350 will locally change the polarization of the radiation interacting with the defect 350 and passing through the semiconductor wafer 150 with respect to polarization of radiation that passes through a region of the semiconductor wafer 150 that is free of polarization-altering defects 350. Radiation in the fourth polarization state 321 may be referred to as fourth radiation.

Radiation that has emerged from the semiconductor wafer 150 will reflect from the mirror 230 producing a fifth polarization state 330 (left circular or left elliptical polarization in this example) and sixth polarization state 323 (left elliptical polarization in this example). A phase reversal upon reflection from the mirror reverses the handedness of the circular or elliptical polarizations. The reflected radiation travels back through the semiconductor wafer 150, and any polarization-altering defects 350 therein, producing radiation in a seventh polarization state 335 (e.g., left circular or left elliptical polarization) and an eighth polarization state 327 (e.g., left elliptical polarization). Because of the second pass of radiation through the polarization-altering defect 350, the radiation in the eighth polarization state 327 has its polarization altered further from the polarization of the radiation in the seventh polarization state 335. Radiation in the fifth polarization state 330 may be referred to as fifth radiation. Radiation in the sixth polarization state 323 may be referred to as sixth radiation. Radiation in the seventh polarization state 335 may be referred to as seventh radiation. Radiation in the eighth polarization state 327 may be referred to as eighth radiation.

Radiation in the seventh polarization state 335 and eighth polarization state 327 can then pass back through the same quarter-wave plate 220 (or a different quarter-wave plate 220 in some implementations), which converts the radiation back to predominantly linear polarized radiation, according to this example, in a ninth polarization state 340. Because of the polarization-altering defect 350, radiation in the sixth polarization state 323 is converted to radiation in a tenth polarization state 329 that emerges from the quarter-wave plate 220 in an elliptical polarization state, for example. Because of the phase reversal upon reflection at the mirror 230, radiation in the ninth polarization state 340 can be linearly polarized in an orientation that is orthogonal to the linear polarization of the first polarization state 315. As such, most of the radiation in the ninth polarization state 340 is blocked by the linear polarizer 210 (or a different linear polarizer if the reflected optical path 304 is diverted away from the forward optical path 302). The amount of radiation in the ninth polarization state 340 that is blocked depends, at least in part, on the extinction ratio of the linear polarizer 210. The amount of radiation in the ninth polarization state 340 that is blocked can also depend on whether the semiconductor wafer 150 is birefringent and the alignment of the quarter-wave plate 220 with respect to the linear polarizer 210.

In some implementations, one or both of the quarter-wave plate 220 and linear polarizer 210 can be mounted on a rotation mount to allow fine adjustment of the rotational alignment of the two components in the system with respect to each other and with respect to the semiconductor wafer 150. Such fine adjustment may be used to reduce background radiation (which may arise from incomplete blocking of light that does not pass through polarization-altering defects 350). The rotation of these polarizing components is around a central axis of the forward optical path 302 (e.g., rotating in the xy plane).

Radiation in the tenth polarization state 329 that has had its polarization altered by the polarization-altering defect 350 can be elliptically, circularly, or even linearly polarized after the quarter-wave plate 220. If linearly polarized, the linear polarization differs from the ninth polarization state. Accordingly, at least a portion of the radiation 360 in the tenth polarization state 329 passes through the linear polarizer 210. "Portion" as used herein means a part of a whole (e.g., between 0% and 100% of the whole).

The portion of the radiation 360 passing through the linear polarizer 210 can produce an image of a bright feature on a darker background. The bright feature is representative of a polarization-altering defect 350 (such as a micropipe) in, on, or extending to the surface of the semiconductor wafer 150. In practice, an objective lens 125 is used to focus the radiation 310 at the location of the semiconductor wafer 150 (e.g., in the bulk of the wafer or at or near a surface of the semiconductor wafer) as well as form an image with radiation collected back from the semiconductor wafer 150. The depth-of-focus (DOF) of the objective lens 125 can be in a range from approximately or exactly 10 microns to approximately or exactly 40 microns. The object location for imaging can be at a surface of the semiconductor wafer 150 or within the bulk of the semiconductor wafer 150. In some cases, the depth-of-focus (DOF) of the objective lens 125 can be in a range from approximately or exactly 1 micron to approximately or exactly 5 microns. In some cases, the depth-of-focus (DOF) of the objective lens 125 can be in a range from approximately or exactly 5 microns to approximately or exactly 10 microns. In some cases, the depth-of-focus (DOF) of the objective lens 125 can be in a range from approximately or exactly 10 microns to approximately or exactly 20 microns. In some cases, the depth-of-focus (DOF) of the objective lens 125 can be in a range from approximately or exactly 20 microns to approximately or exactly 30 microns. In some cases, the depth-of-focus (DOF) of the objective lens 125 may be in a range from approximately or exactly 30 microns to approximately or exactly 70 microns. In some cases, the depth-of-focus (DOF) of the objective lens 125 may be in a range from approximately or exactly 70 microns to approximately or exactly 100 microns.

In some implementations, the linear polarizer 210 can be oriented at an angle other than 45 degrees with respect to the fast axis of the quarter-wave plate. An orientation other than 45 degrees can occur, for example, if the wafer exhibits birefringence. Additionally, an orientation other than 45 degrees may be selected to provide simultaneous imaging of polarization-altering defects and non-polarization-altering defects, as described further below. The orientation of the polarization axis of the linear polarizer 210 with respect to the fast axis of the quarter-wave plate 220 can be a value from approximately or exactly 5° to approximately or exactly 85°, or any subrange therebetween (e.g., from 35° to 55°, 45°±4°, 45°±2°, from 25° to 65°, etc.)

In some cases, a more generic wave plate or retarder having a relative phase delay between orthogonal polarization components less than or greater than a quarter wave can be used instead of, and in the place of, the quarter-wave plate. A wave plate having a relative phase delay less than or greater than a quarter wave can be used for wafers that exhibit birefringence. A wave plate for this purpose may retard the phase of one orthogonal component of polarization by an angle less than or greater than 90 degrees with respect to the phase of the other orthogonal component of polarization for the optical wave passing through the wave plate. Such a wave plate may be a custom wave plate. The angle of retardation can be from approximately or exactly 5 degrees to approximately or exactly 89 degrees or from approximately or exactly 91 degrees to approximately or exactly 175 degrees. In such cases, the wave plate can be installed with its fast axis at a fixed angle with respect to the linear polarizer 210 and not be rotatable with respect to the linear polarizer 210. In some cases, the wave plate can be rotatable with respect to the linear polarizer 210.

Figure 4A:
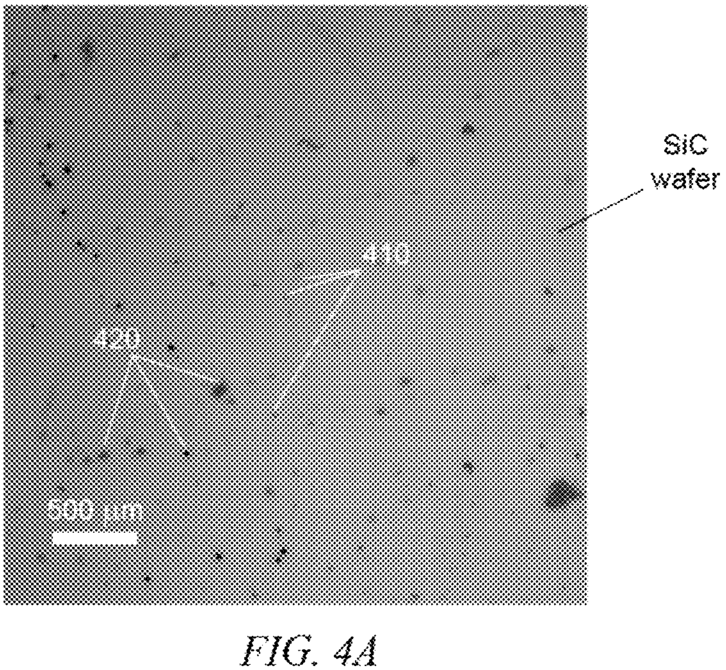
FIG. 4A is an image of a SiC wafer using reflected bright-field microscopy without polarization-sensitive imaging.

FIG. 4A is an image of a SiC wafer using reflected bright-field microscopy without polarization-sensitive imaging. Defects and contaminants are visible in bright-field microscopy as darker features on a brighter background. Some features 410, 420 are marked for comparison with the image of FIG. 4B.

Figure 4B:
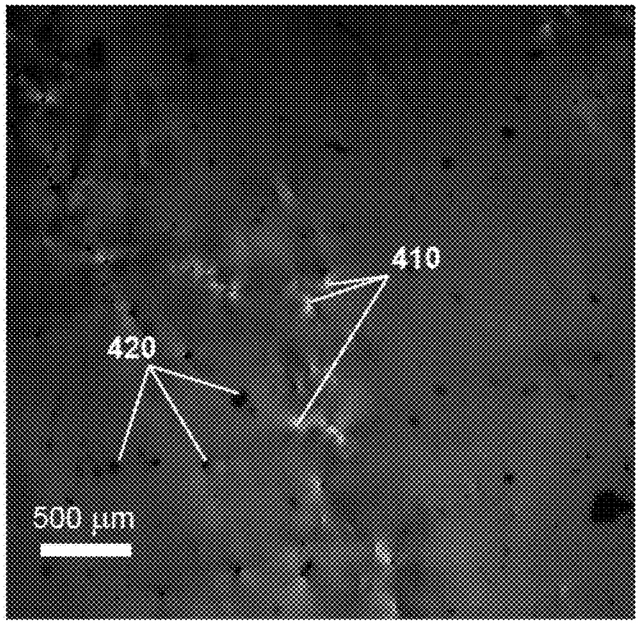
FIG. 4B is a microscopic image of the silicon carbide (SiC) wafer of FIG. 4A obtained with an adapted wafer inspection system. The image includes bright features indicating the presence of micropipe defects.

FIG. 4B comprises a polarization-sensitive microscopic image of a region of a SiC semiconductor wafer 150 obtained with a wafer inspection system 100 adapted with optical components to detect polarization-altering defects 350, as described above. The polarization-altering defects 350 show up as bright features 410 (which may be referred to as "comets") on a darker background. For example, the pixel intensity level for a bright feature 410 can be higher than the average pixel intensity level of the background by at least 20%, at least 50%, or at least 100%. In some systems, the image intensity may be inverted such that the polarization-altering defects 350 show up as dark features on a brighter background level. For example, the pixel intensity level for a polarization-altering defects 350 can be lower than the average pixel intensity level of the background by at least 20%, at least 50%, or at least 80%. Three of the more prominent bright features 410 are marked in the image, though many other bright features are visible indicating the presence of a number of polarization-altering defects 350 (such as micropipes).

Computer image processing can be performed on images like those of FIG. 4B to determine a number of polarization-altering defects 350 per unit area of the semiconductor wafer 150 for wafer screening. For example, bright features 410 having localized intensity peaks above a threshold value and having a full-width-half-maximum (FWHM) radius or FWHM diameter less than a threshold value can be counted as a defect to determine a number of polarization-altering defects 350 within the field-of-view (FOV) of the recorded image. Bright features 410 having broader radii or diameters and lower peak values may not be counted as a polarization altering defect. Several images can be obtained for different regions of the semiconductor wafer 150 and processed to determine an average defect density for the wafer. Wafers exceeding a threshold defect density can be rejected from further semiconductor processing.

Also visible in the polarization-sensitive microscopic image of FIG. 4B are dark features 420 on a lighter background. The dark features 420 are associated with additional defects (such as carbon inclusions and contaminants) in or on the semiconductor wafer 150. The dark features 420 are visible because the optics are configured to not block all of the radiation in the ninth polarization state 340 returning from the quarter-wave plate 220. For example, the quarter-wave plate 220 may be oriented to produce radiation that is not purely circularly polarized, such that the ninth polarization state 340 is not linearly polarized in an orientation orthogonal to the transmission axis of the linear polarizer 210. As such, a bright-field microscope image of the same region of the semiconductor wafer 150 is obtained and superimposed with the polarization-sensitive microscopic image. Such imaging can allow for simultaneous detection of polarization-altering defects 350 (such as micropipes) and non-polarization-altering defects (such as contaminants and inclusions) without changing optics in the system's inspection head 120. In some implementations, wafer screening can be based on a combination of polarization-altering defects 350 and non-polarization-altering defects.

Defect markings in FIG. 4A correspond to the locations of the same defects in FIG. 4B. From the image comparison, it is not possible to tell which of the defects in the bright-field image of FIG. 4A are potentially device-failure-inducing micropipes and which are not. The adapting optics, described in connection with FIG. 2 and FIG. 3 convert the wafer inspection system 100 into a tool that can detect polarization-altering defects in SiC semiconductor wafers and other wafers. Such polarization-altering defects can include, but are not limited to, micropipe defects, screw dislocations, slip lines, slip planes, and defects that create localized internal stress and strains causing stress-induced birefringence. The spatial extent of the polarization-altering defect can be from micron scale to millimeter scale (e.g., from approximately or exactly 5 μm to approximately or exactly 5 mm). In some cases, smaller defects may be detected (e.g., as small as 1 μm, as small as 250 nanometers).

3. ADDITIONAL SYSTEM IMPLEMENTATIONS

Figure 5:
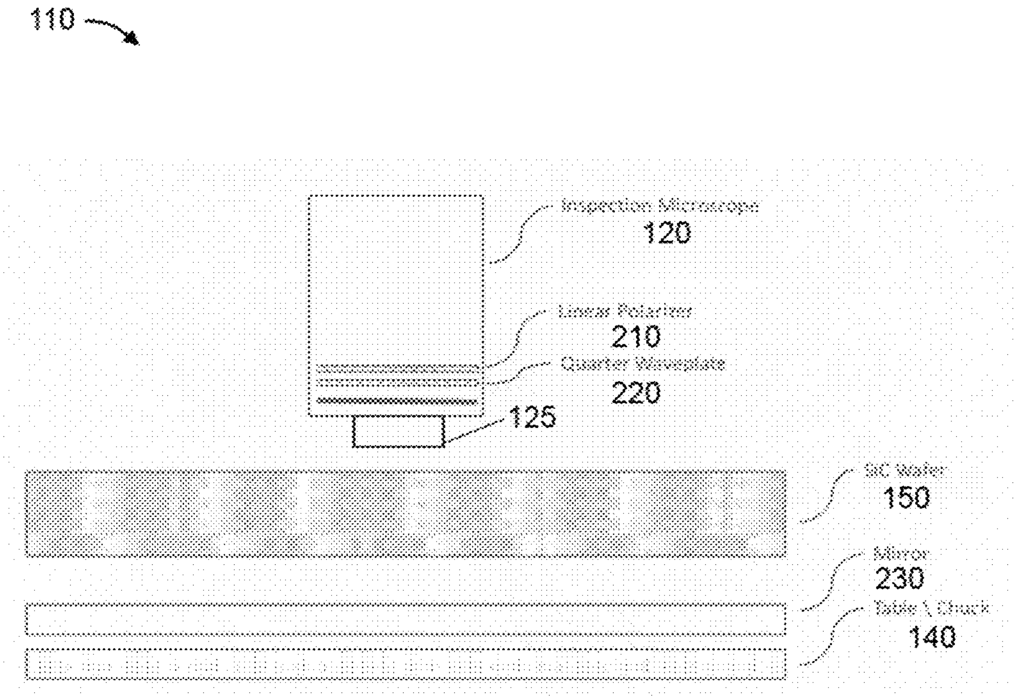
FIG. 5 depicts another example arrangement of optics to adapt a wafer inspection system (such as the system of FIG. 1) to an apparatus that can also detect polarization-altering defects.

FIG. 5 depicts another arrangement of optical components for adapting a wafer inspection system 100 to detect polarization-altering defects. In this implementation, the linear polarizer 210 and quarter-wave plate 220 are placed above the objective lens 125 of the inspection head 120. For example, the linear polarizer 210 and quarter-wave plate 220 can be located between the illumination source 121 of the inspection head 120 and the objective lens 125. In such an arrangement, the linear polarizer 210 and quarter-wave plate 220 can be located in a portion of the optical path of the inspection head 120 where an illumination beam from the illumination source 121 is collimated. Locating the linear polarizer 210 and quarter-wave plate 220 in a collimated portion of the illumination beam may provide better contrast and image quality than locating the linear polarizer 210 and quarter-wave plate 220 after the objective lens 125 where the illumination beam is not collimated.

As noted above, the drawings are not to scale and are intended to generally describe an arrangement of the optical components in the wafer inspection system 100. For example, the semiconductor wafer 150 would typically be thinner than the mirror 230 and the wafer chuck 140. The relative distances between the different components may be significantly different than depicted in the drawings of FIG. 2, FIG. 3, FIG. 5, and other drawings referred to below.

Figure 6A:
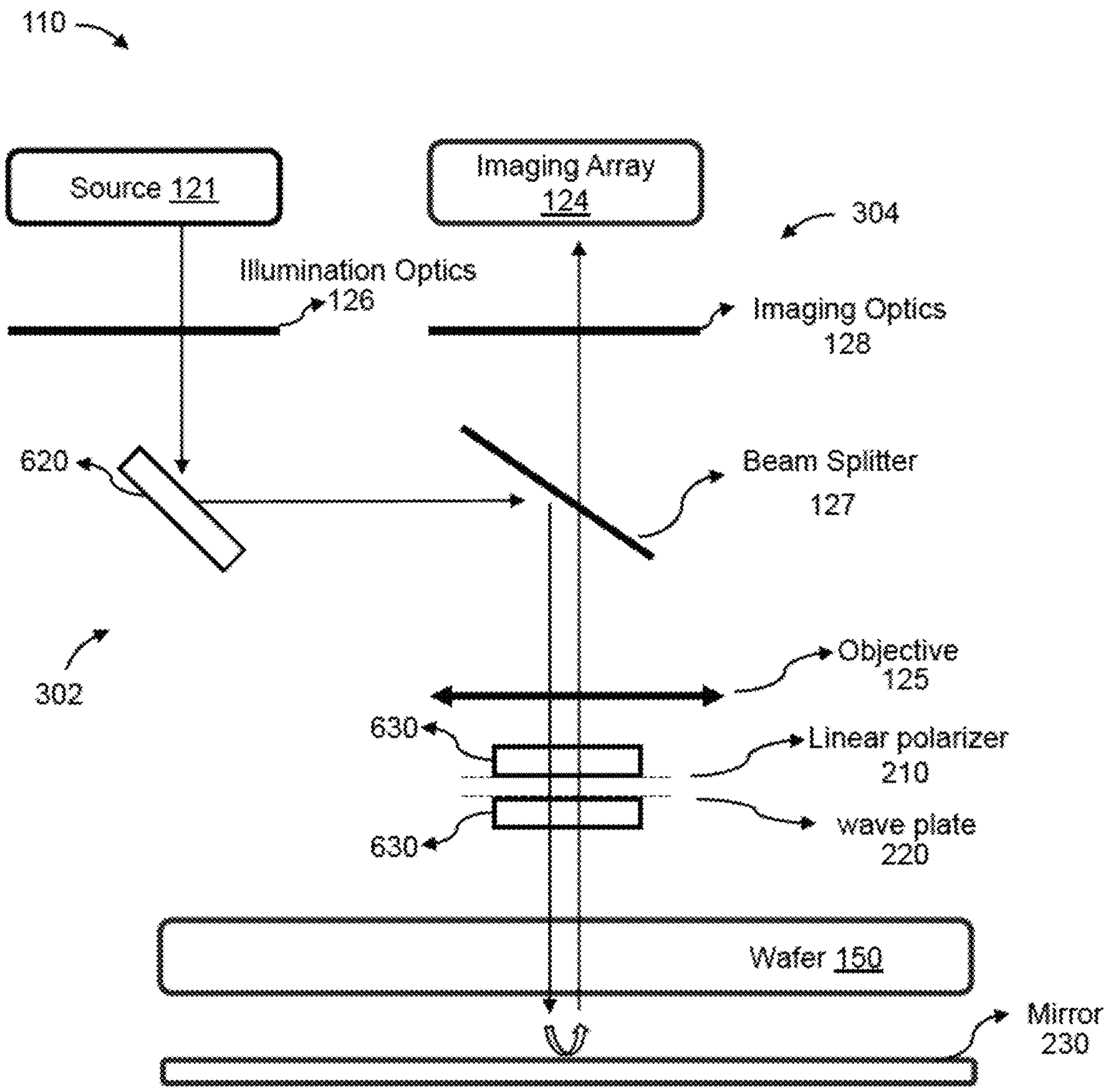
FIG. 6A depicts another example arrangement of optics to adapt a wafer inspection system (such as the system of FIG. 1) to an apparatus that can also detect polarization-altering defects.

FIG. 6A depicts another arrangement of optical components for adapting a wafer inspection system 100 to detect polarization-altering defects. The inspection instrument 110 is similar to that of FIG. 2 in that the linear polarizer 210 and quarter-wave plate 220 are located between the objective lens 125 and the semiconductor wafer 150. One or both of the linear polarizer 210 and quarter-wave plate 220 can be mounted on an adjustable mount 630. The adjustable mount can comprise a rotation mount (e.g., to adjust an angle of the polarization axis of the linear polarizer 210 with respect to a fast axis of the quarter-wave plate 220). The adjustable mount may additionally, or alternatively, include tilt adjustment (e.g., to adjust an angle between the planar surface of the linear polarizer 210 or quarter-wave plate 220 and an optical axis of light passing through the linear polarizer 210 or quarter-wave plate 220) such that Fresnel reflections from surfaces of the linear polarizer 210 and/or quarter-wave plate 220 are deflected out of the optical path of light passing through the linear polarizer 210 or quarter-wave plate 220. A first portion of the forward optical path 302 from the illumination source 121 is offset from a first portion of the reflected optical path 304 that includes the imaging array 124. A folding mirror 620 and beamsplitter 127 can be used to align a second portion of the forward optical path 302 with a second portion of the reflected optical path 304. Radiation from the reflected optical path 304 can form an image (like that of FIG. 4A) onto the imaging array 124 for recordation and/or analysis.

Figure 6B:
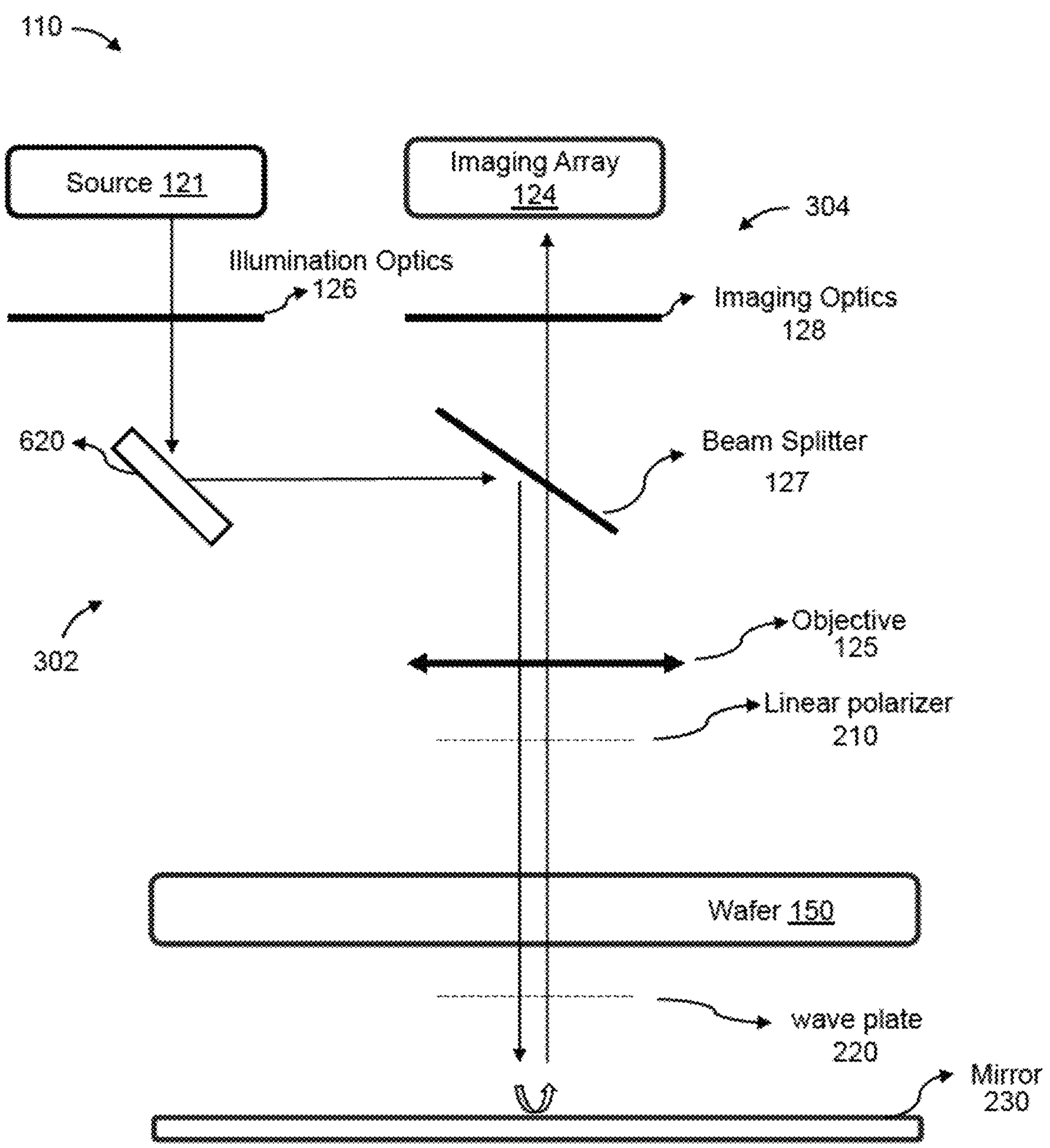
FIG. 6B depicts another example arrangement of optics to adapt a wafer inspection system (such as the system of FIG. 1) to an apparatus that can also detect polarization-altering defects.

The linear polarizer 210 and quarter-wave plate 220 can be located at different positions in the forward optical path 302 and reflected optical path 304 in some implementations of the inspection instrument 110. In FIG. 6B, the linear polarizer is located between the objective lens 125 and semiconductor wafer 150, whereas the quarter-wave plate 220 is located between the wafer 150 and the mirror 230. In general, the linear polarizer 210 can be located anywhere between the illumination source 121 and the semiconductor wafer 150, and the quarter-wave plate 220 can be located anywhere between the linear polarizer 210 and the mirror 230 in the forward optical path. If either or both of the linear polarizer 210 and quarter-wave plate 220 are located in a portion of the forward optical path 302 that is not collinear with the reflected optical path 304, then a second linear polarizer and/or quarter-wave plate can be placed in the portion of the reflected optical path 304 that is not collinear with the forward optical path 302.

Figure 6C:
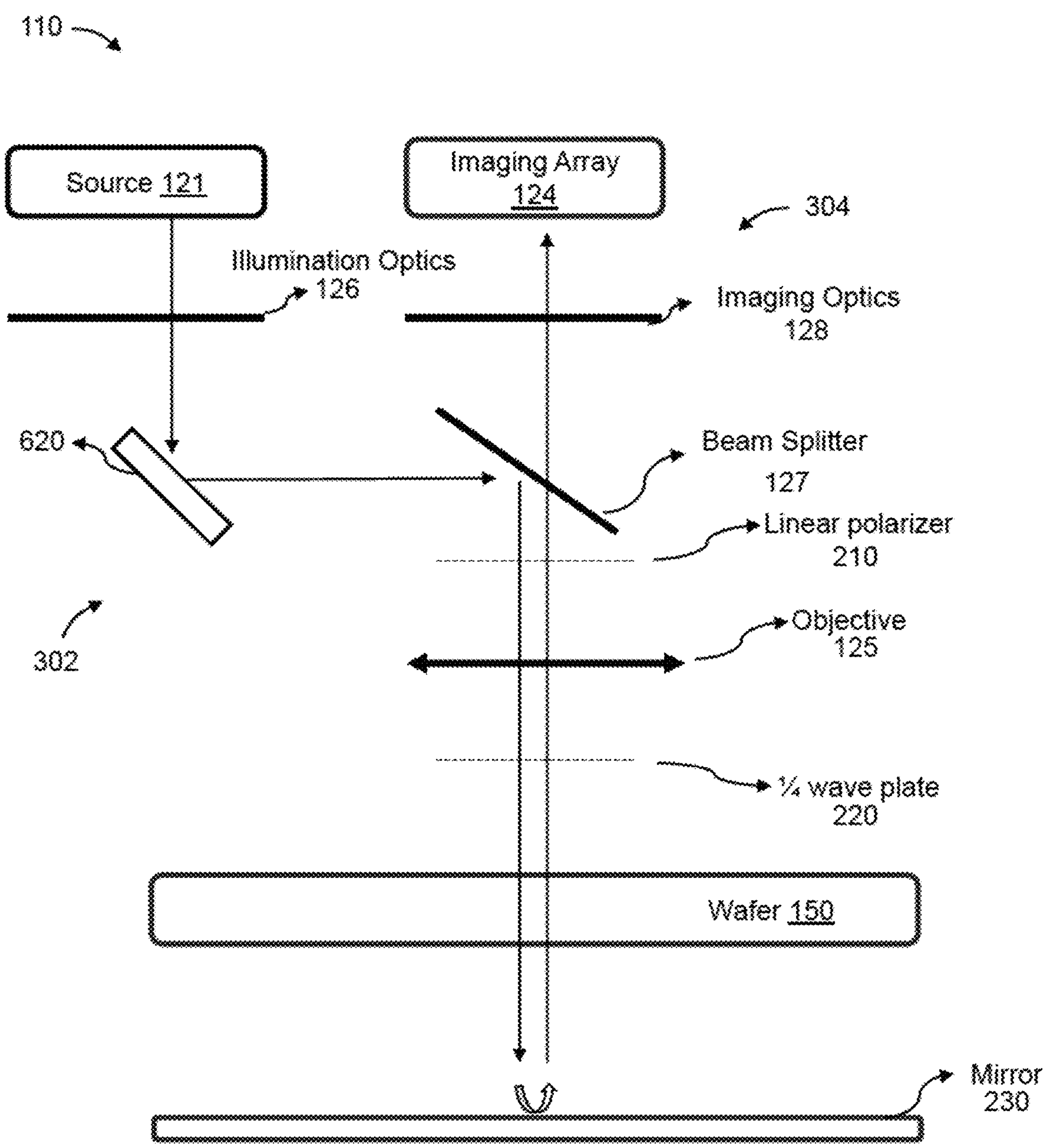
FIG. 6C depicts another example arrangement of optics to adapt a wafer inspection system (such as the system of FIG. 1) to an apparatus that can also detect polarization-altering defects.

FIG. 6C depicts another arrangement of polarizing components in the inspection instrument 110. In this arrangement, the linear polarizer 210 is located between the illumination source 121 and the objective lens 125. The quarter-wave plate 220 is located between the objective lens 125 and the semiconductor wafer 150. In another implementation, the quarter-wave plate 220 can be located between the semiconductor wafer 150 and the mirror 230.

Figure 7:
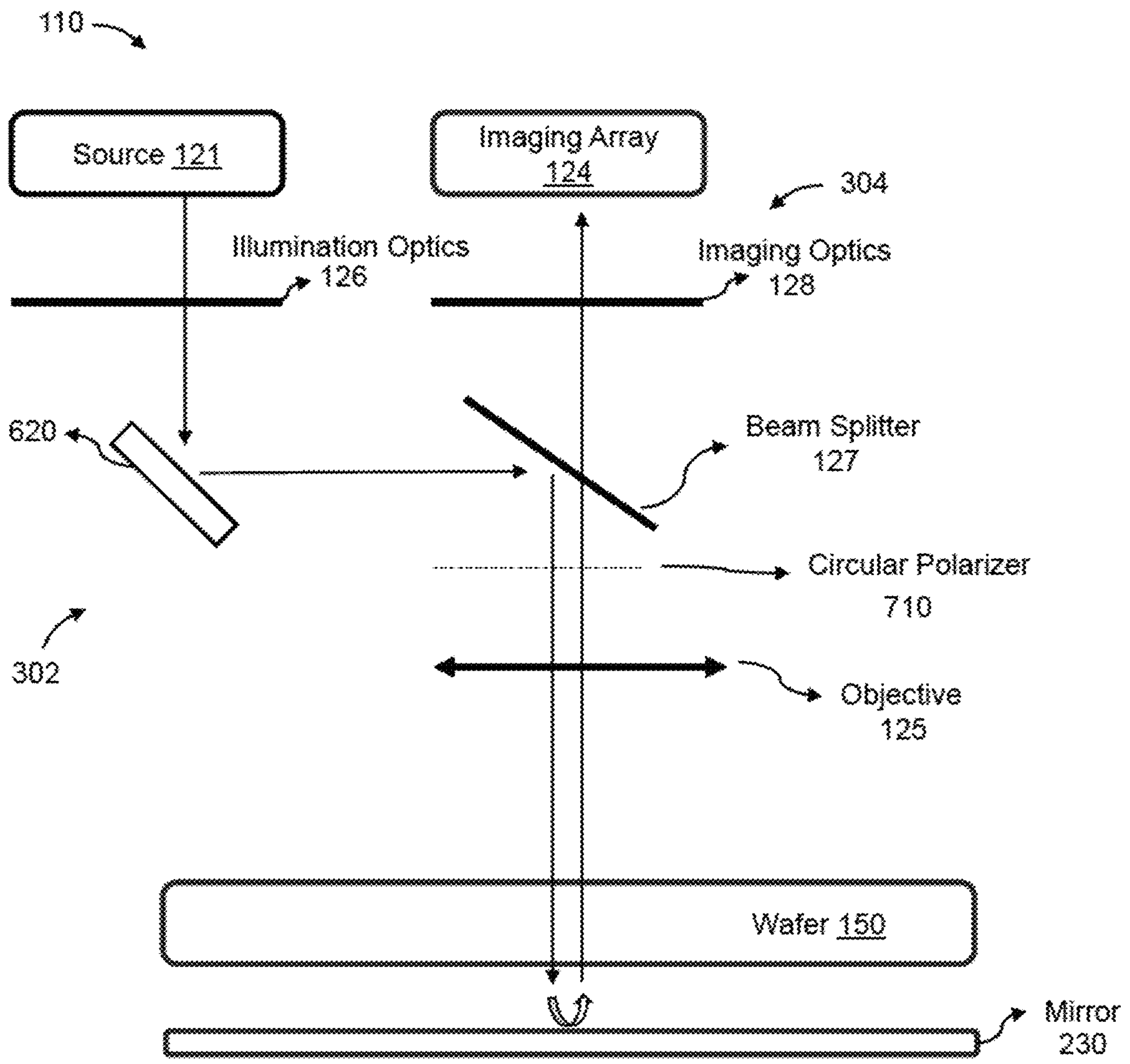
FIG. 7 depicts another example arrangement of optics to adapt a wafer inspection system (such as the system of FIG. 1) to an apparatus that can also detect polarization-altering defects.

FIG. 7 depicts another implementation of an inspection instrument 110. In this implementation, a circular polarizer 710 is used instead of a linear polarizer 210 that is separated from a quarter-wave plate 220. The circular polarizer 710 can comprise a linear polarizer combined with and/or mounted together with a quarter-wave plate as a single optical component. An example of a circular polarizer is the left-handed circular polarizer (item CP1L633) available from Thorlabs of Newton, New Jersey, though a right-handed circular polarizer can also be used. The circular polarizer 710 can receive random or unpolarized radiation and output circularly polarized radiation. In some implementations, an elliptical polarizer can be used instead of a circular polarizer 710 or a linear polarizer 210 that is separated from a quarter-wave plate 220. The elliptical polarizer can comprise a linear polarizer combined with a quarter-wave plate as a single optical component wherein the linear polarizer is aligned with the quarter-wave plate to produce elliptical polarization.

An advantage of having the linear polarizer 210 and quarter-wave plate 220 mounted in the inspection instrument 110 as separate components is that the state of polarization output from the quarter-wave plate 220 in the forward optical path 302 can be adjusted. For example, one or both of the linear polarizer 210 and quarter-wave plate 220 can be mounted on a rotation amount to adjust the output polarization's degree of ellipticity (e.g., from circular to some amount of elliptical) and orientation (e.g., orientation of a major axis of elliptically polarized radiation or orientation of the linearly polarized radiation in the system with respect to a crystallographic axis of the semiconductor wafer). For wafers that may exhibit birefringence, it can be beneficial (in terms of resulting image contrast and imaging quality) to illuminate the wafer with elliptically-polarized radiation oriented at a particular angle instead of circularly-polarized radiation. The orientation and degree of ellipticity of the elliptically-polarized radiation can be set empirically by rotating the quarter-wave plate 220 to increase or maximize the contrast of the detected image of the semiconductor wafer 150 and the polarization-altering defect(s) 350.

The circular polarizer 710 can be located in the inspection instrument 110 between the illumination source 121 and the objective lens 125, as shown in FIG. 7. In other implementations, the circular polarizer 710 can be located between the objective lens 125 and the semiconductor wafer 150.

Figure 8:
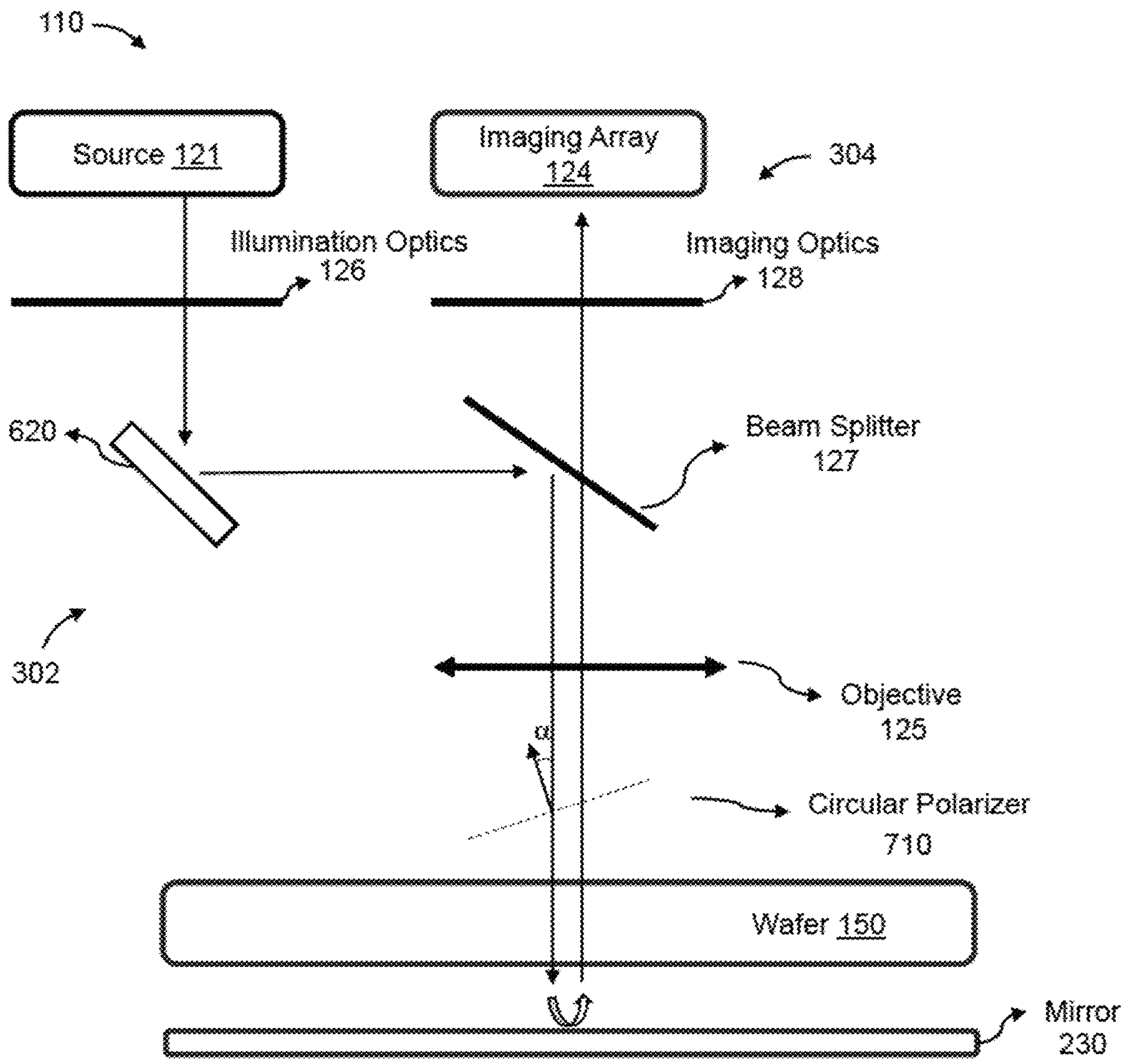
FIG. 8 depicts another example arrangement of optics to adapt a wafer inspection system (such as the system of FIG. 1) to an apparatus that can also detect polarization-altering defects.

There are several ways to reduce unwanted Fresnel reflections from the polarizing optical components (linear polarizer, quarter-wave plate, circular polarizer) and other optical components added to the inspection instrument 110. Fresnel reflections can occur at an interface between two materials (e.g., glass and air) having two different refractive index values. One way to reduce unwanted reflections is to have the optical components coated with antireflection (AR) coatings on surfaces of optical components in the optical paths. Additionally, or alternatively, the optical components in any of the above-described systems can be oriented in the systems at an angle $\alpha$ with respect to the incident beam, an example of which is depicted in FIG. 8, to direct any unwanted Fresnel reflections out of the reflected optical path 304 so that the unwanted Fresnel reflections will not be collected and/or imaged onto the imaging array 124. The tilt angle α with respect to the optical path can be from approximately or exactly 1 degree to approximately or exactly 40 degrees, for example. In some cases, the tilt angle can be less than 1 degree, less than 2 degrees, less than 3 degrees, less than 4 degrees, less than 5 degrees, less than 10 degrees, or less than 20 degrees. Small (e.g., less than 2 degrees) or no tilt angles α can be used for the quarter-wave plate(s) 220 (e.g., to avoid producing elliptical polarization when circular polarization is needed). Larger tilt angles may be used for the linear polarizer(s) 210.

Figure 9:
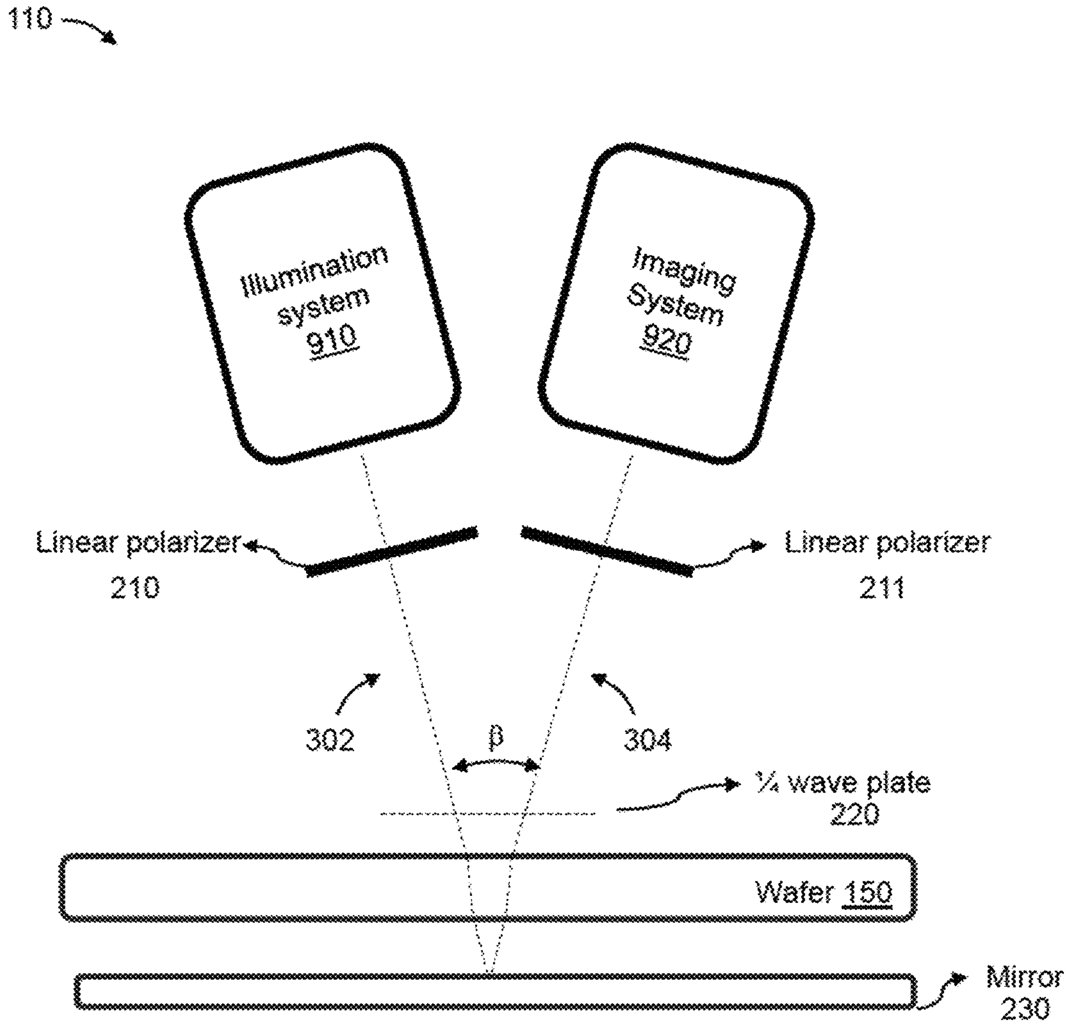
FIG. 9 depicts an example arrangement of optics in a wafer inspection system that is adapted to detect polarization-altering defects.

Another implementation of an inspection instrument 110 is depicted in FIG. 9. In this implementation, the forward optical path 302 is incident on the semiconductor wafer 150 at a first angle, and the reflected optical path 304 emerges from the semiconductor wafer 150 at an angle β greater than zero degrees with respect to the forward optical path 302. The forward optical path 302 also passes through the semiconductor wafer 150 at an angle greater than zero degrees with respect to the reflected optical path 304 that passes back through the semiconductor wafer. The forward optical path 302 is separated from the reflected optical path 304, though the forward optical beam may spatially overlap with the reflected optical beam at the semiconductor wafer 150. The angle β can be from approximately or exactly 0.2 degrees to approximately or exactly 30 degrees.

An illumination system 910 is located at the beginning of the forward optical path 302. The illumination system 910 can include an illumination source and illumination optics to form an illumination beam that travels along the forward optical path 302. The illumination beam can be collimated or focused onto the semiconductor wafer 150. A first linear polarizer 210 is located along the forward optical path 302 to produce linearly-polarized radiation, in this example.

An imaging system 920 is located at an end of the reflected optical path 304 to acquire an image of defects in or on the semiconductor wafer 150. The imaging system 920 can include an imaging array, an objective lens, and other imaging optics to form an image of defects in or on the semiconductor wafer onto the imaging array. A second linear polarizer 211 can be located along the reflected optical path 304. A polarization axis of the second polarizer 211 can be oriented approximately parallel to a polarization axis of the first polarizer 210.

A single quarter-wave plate 220 can be placed in the inspection instrument at a location that intercepts both the forward optical path 302 and the reflected optical path 304. However, two quarter-wave plates can be used in other implementations (e.g., one in each of the forward optical path 302 and the reflected optical path 304). In some cases, the angle β can be small (e.g., less than 10 degrees) such that the forward illumination beam traveling along the forward optical path 302 significantly overlaps with the return beam traveling along the reflected optical path 304 in the semiconductor wafer 150.

4. ALTERNATIVE DETECTION OF BIREFRINGENT POLARIZATION-ALTERING DEFECTS

Figure 10:
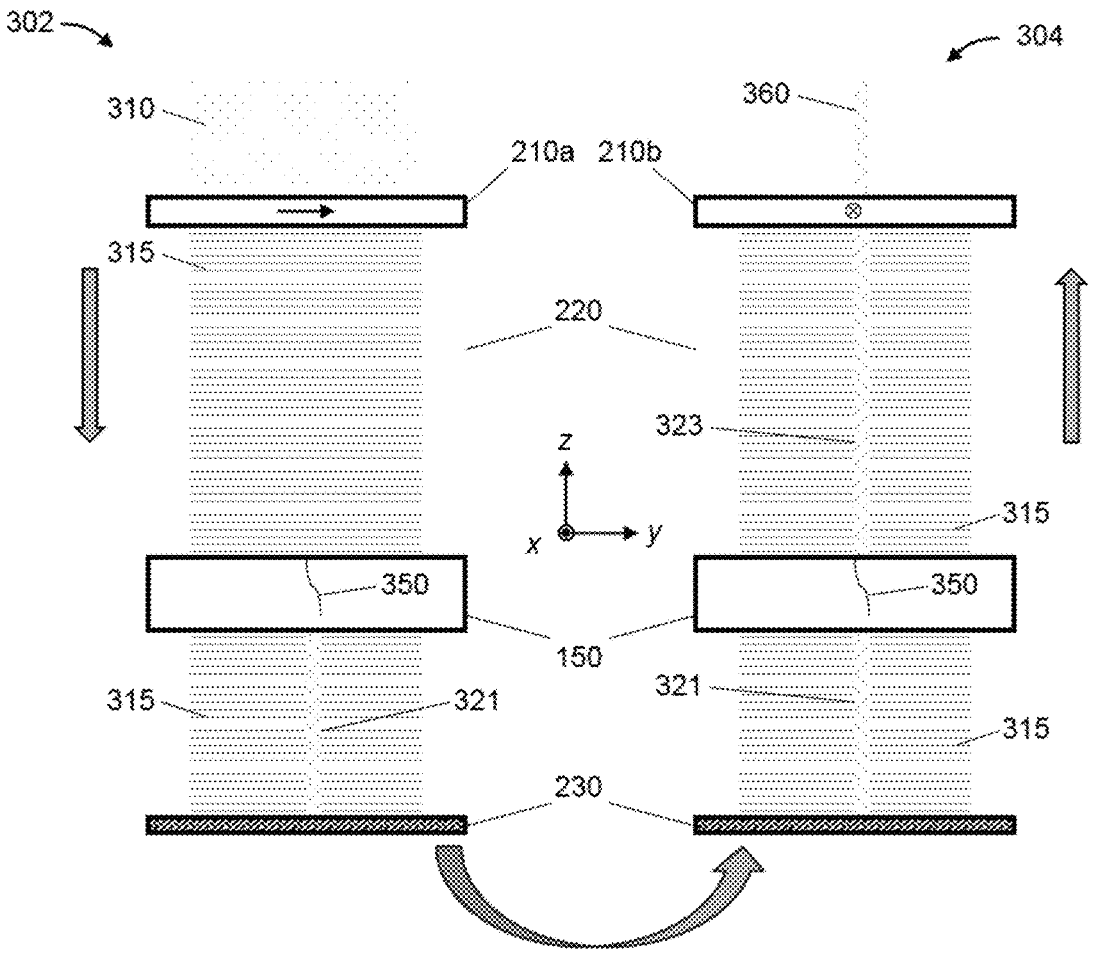
FIG. 10 illustrates how a wafer inspection system can be adapted with linear polarizers and no quarter-wave plate to detect polarization-altering defects.

According to some implementations, a quarter-wave plate may not be used in an inspection instrument 110. For example, the quarter-wave plate 220 can be removed from the foregoing systems. When a quarter-wave plate 220 is not used, two linear polarizers 210 can be installed in the system (one in the forward optical path 302 and one in the reflected optical path 304) and oriented with their polarization axes orthogonal to each other. FIG. 10 depicts how such implementations could detect polarization-altering defects that exhibit birefringence in a case where the semiconductor wafer 150 exhibits no or negligible birefringence. Radiation from an illumination source can be linearly polarized by a first linear polarizer 210*a* to produce radiation in the first polarization state 315. The illumination radiation should remain in the first polarization state 315 throughout the inspection instrument unless (a) it encounters a polarization-altering defect 350 or (b) the semiconductor wafer 150 is birefringent and the linear polarization is not aligned with an eigenaxis of the birefringent semiconductor wafer 150. In the illustration of FIG. 10, the bulk of the semiconductor wafer 150 is not birefringent.

Illumination radiation that interacts with a polarization-altering defect 350 as it travels through the semiconductor wafer 150 along the forward optical path 302 will have its polarization altered from the linear polarization to a second polarization state 321. The second polarization state 321 can be elliptical or circular (with right handedness or left handedness) depending on the properties and length of the polarization-altering defect 350. Upon reflection from the mirror 230, the handedness of the elliptical or circular polarization will reverse. Illumination radiation that interacts with the polarization-altering defect 350 as it travels back through the semiconductor wafer 150 along the reflected optical path 304 will have its polarization further altered to a third polarization state 323.

The return radiation will then be incident on a second linear polarizer 210*b*. The second linear polarizer 210*b* can be oriented such that its polarization axis is orthogonal to the polarization axis of the first linear polarizer 210*a* and/or orthogonal to the polarization of the return optical beam having the first polarization state 315. In this orientation, the second linear polarizer 210*b* will block most of the return radiation except at least a portion of the radiation 360 that interacted with the polarization-altering defect 350. The portion of the radiation 360 that passes through the second linear polarizer 210*b* can then be used to form an image of the polarization-altering defect 350 on an imaging array.

If the semiconductor wafer 150 is birefringent, then detection of the birefringent polarization-altering defect 350 can still occur provided the birefringence of the defect 350 differs from the birefringence of the semiconductor wafer 150 and the eigenaxis of at least one of the defect 350 and semiconductor wafer 150 is not aligned to the polarization axis of the first linear polarizer 210*a*. The resulting image may produce a bright polarization-altering defect 350 on a darker background or a dark polarization-altering defect 350 on a brighter background depending on the relative amounts of birefringence of the defect 350 and semiconductor wafer 150. For example, if the semiconductor wafer 150 exhibits more birefringence than the polarization-altering defect 350 and the first linear polarizer 210*a* is not aligned to the eigenaxes of either the polarization-altering defect 350 or the semiconductor wafer 150, then more of the light passing through the defect-free regions of the semiconductor wafer 150 will have its polarization state altered more than light passing through the polarization-altering defect 350. Accordingly, more of the light passing through the defect-free regions of the semiconductor wafer 150 will pass through the second linear polarizer 210*b*, such that the polarization-altering defect 350 will appear as a darker feature on a brighter background. If the first linear polarizer

210*a* were rotated such that its polarization axis is aligned with the eigenaxis of the semiconductor wafer 150, then light passing through the defect-free regions of the semiconductor wafer 150 would not have its polarization state altered and would be blocked by the second linear polarizer 210*b*. In this case, the polarization-altering defect 350 will appear as a brighter feature on a darker background.

In yet a further implementation, only one linear polarizer 210*b* can be used in an inspection instrument 110. For example, the illumination source 121 can output linearly polarized light such that the first linear polarizer 210*a* is not needed. The second linear polarizer 210*b* can be oriented such that its polarization axis is orthogonal to the linear polarization output by the illumination source 121.

5. WAFER CHUCK AND ADAPTERS

Figure 11:
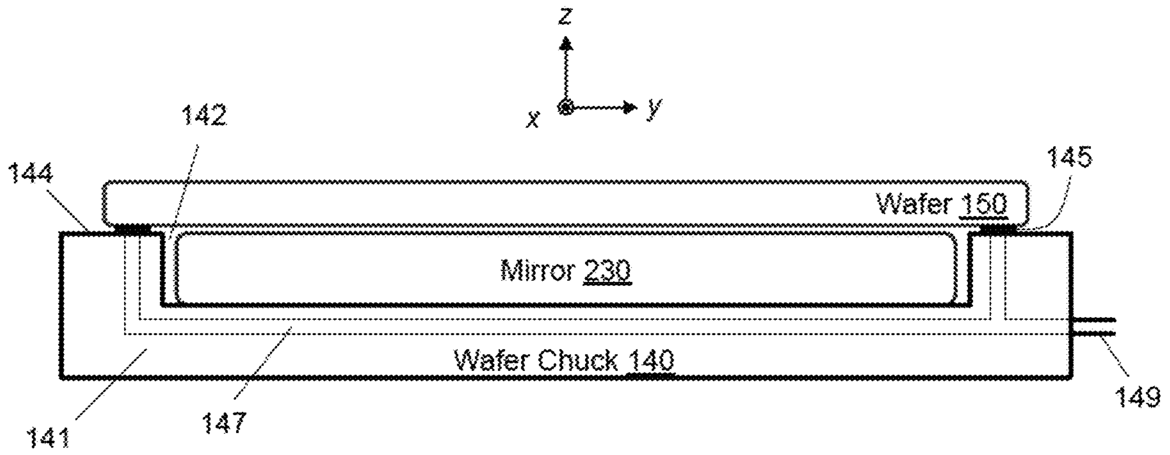
FIG. 11 depicts an example of a wafer chuck that can be used in a wafer inspection system (such as the system of FIG. 1).

FIG. 11 depicts an example of a wafer chuck 140 that can be used to hold the semiconductor wafer 150 in an inspection instrument 110 of a wafer inspection system 100 described in any of the foregoing implementations. The wafer chuck 140 can be mounted on a positioning stage 130 (shown in FIG. 1) in the wafer inspection system 100 to scan the wafer laterally with respect to the inspection head 120. Scanning the semiconductor wafer 150 laterally (e.g., in x and y directions) can allow for inspection of the entire wafer.

The wafer chuck 140 comprises a body 141, which can be made from a metal (such as stainless steel, aluminum, an aluminum alloy, titanium, and/or a titanium alloy, for example). There can be a recess 142 in the body 141 in which the mirror 230 is mounted. The wafer chuck 140 comprises a ledge 144 above the recess that can support the semiconductor wafer 150 above the mirror 230 without a backside of the semiconductor wafer touching the mirror. The gap or distance between the surface of the mirror 230 and the backside of the semiconductor wafer 150 can be from approximately or exactly 20 microns to approximately or exactly 2 millimeters, or any subrange within these two values. In some implementations, the semiconductor wafer 150 can contact the mirror 230 and there may be no gap. The wafer chuck 140 can include vacuum features or mechanical features (such as clasps or jaws) to secure the semiconductor wafer 150 to the wafer chuck 140. The vacuum features can include vacuum lumens 147 and a vacuum port 149 fluidically coupled to the vacuum lumens 147. Vacuum can be applied to the wafer chuck 140 via the vacuum port 149.

The vacuum features can further include orifices 145 located on the ledge 144 of the wafer chuck 140, such that the orifices 145 are distributed around a peripheral region of the semiconductor wafer 150. The peripheral region can be limited to an annular ring at the edge of the semiconductor wafer 150 that extends inward from the edge of the semiconductor wafer no more than 8 mm, for example. There can be from 3 to 24 orifices 145 on the wafer chuck 140 that lie within this annular ring. Vacuum at the orifices 145 can pull peripheral regions of the semiconductor wafer 150 into contact with the wafer chuck 140 or O-rings disposed at the orifices 145 to secure the semiconductor wafer 150 to the wafer chuck 140. In some implementations, an O-ring can be located at each orifice 145 to assist in providing a vacuum seal at each orifice 145. The O-rings can be formed from Teflon®, silicone, or another polymer. By contacting the semiconductor wafer 150 at only a few locations on the backside of the wafer and supporting the semiconductor wafer 150 above the mirror 230, contamination of the semiconductor wafer can be avoided or minimized.

Figure 12:
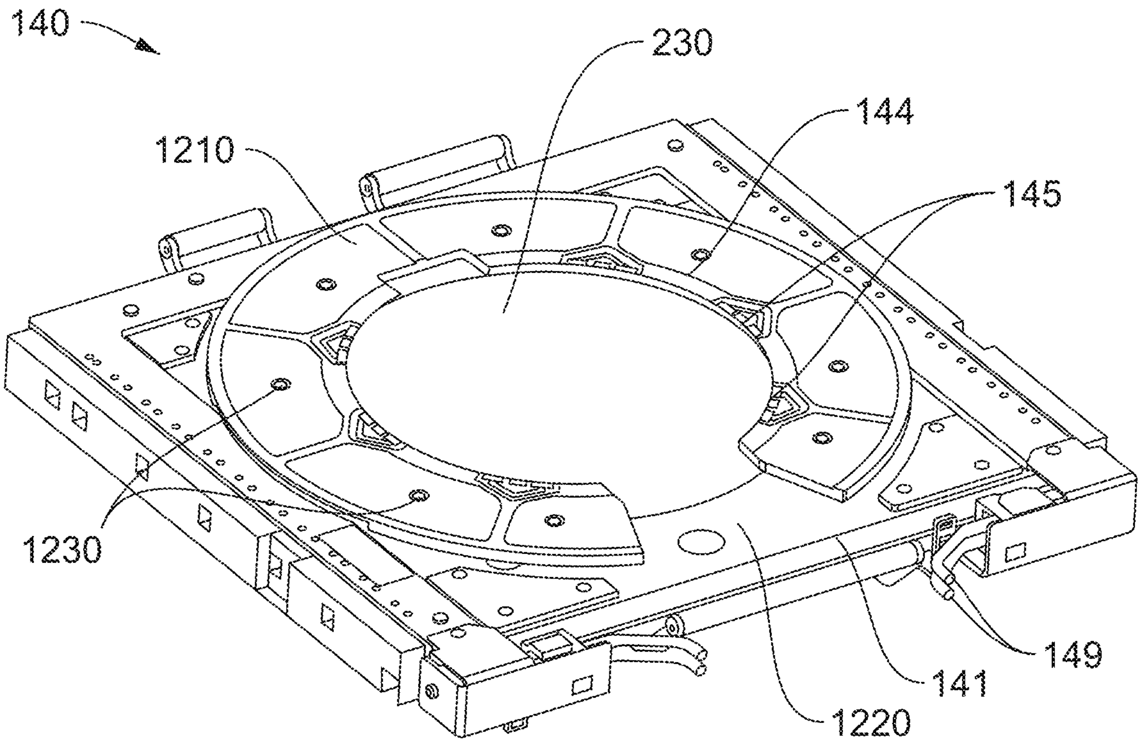
FIG. 12 depicts details of a wafer chuck and adapter that can be used in a wafer inspection system (such as the system of FIG. 1).

FIG. 12 is a perspective view of an example implementation of a wafer chuck 140 that includes an adapter 1210 to adapt the wafer chuck for use in any of the above-described inspection systems. In this example, the adapter 1210, which is annular in shape, mounts to the body 141 of the wafer chuck 140. Adapters having other peripheral shapes (square, pentagonal, hexagonal, polygonal, etc.) can be used in other implementations. The adapter 1210 provides the ledge 144 to elevate the semiconductor wafer above the mirror 230, which can mount within or below the adapter 1210. In some cases, a backlight can be installed behind the wafer (e.g., within the wafer chuck 140) instead of the mirror for backside illumination of the wafer. Backside illumination may be used to detect defects (polarization-altering and non-polarization-altering) in some implementations of the system.

Figure 13:
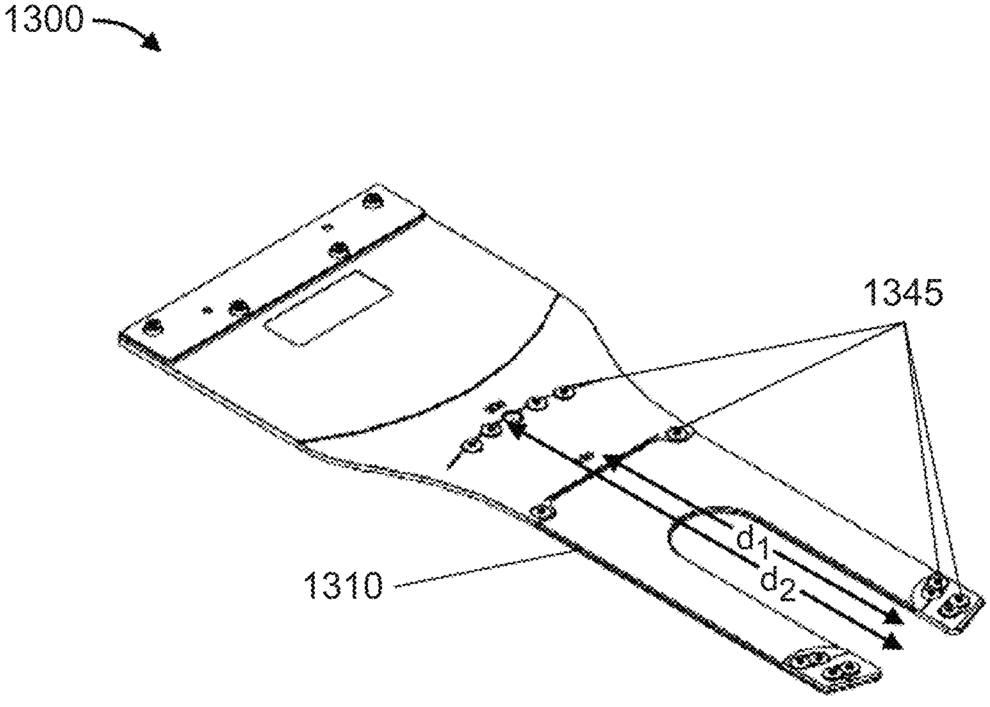
FIG. 13 depicts a wafer-gripping end effector that can be used to load and unload semiconductor wafers onto and from the wafer chuck and adapter of FIG. 12.

The adapter 1210 can be formed from a metal and sized to hold a particular wafer size (e.g., 150-mm-diameter wafers, 200-mm-diameter wafers, etc.). A few screws 1230 can secure the adapter 1210 to the body 141 of the wafer chuck 140 and allow easy interchange of different size adapters for different wafer sizes. The adapter 1210 can be semi-annular in shape with at least one cut-out 1220. The cut-out 1220 provides access for entry of a wafer-loading/unloading tool (such as a wafer-gripping end effector) into a central region of the adapter, which is depicted in FIG. 13. Orifices 145 to hold the wafer can be located along an inside edge of the adapter 1210 (e.g., within 8 mm of the inside edge of the annular-shaped ring).

If the mirror 230 is smaller in area than the semiconductor wafer 150, then the adapter 1210 can be mounted on a rotation mount and/or translation stage. Then, the semiconductor wafer 150 can be moved (e.g., rotated and/or shifted) with respect to the mirror 230 so that the entire semiconductor wafer can be inspected. The rotation mount and/or translation stage supporting the adapter 1210 can be automated and communicatively coupled to and controlled by the controller 112.

The end effector 1300 of FIG. 13 can be used to grip a semiconductor wafer (from a cassette, for example) and load the wafer onto the vacuum chuck 140. The end effector 1300 can be formed from a metal and have a long, broad and thin arm 1310 that can reach under or over a semiconductor wafer. There can be a plurality of orifices 1345 in the arm 1310 for applying a vacuum to grip the semiconductor wafer at a plurality of locations. The example wafer-gripping end effector 1300 of FIG. 13 is designed to grip 150-mm-diameter wafers $d_1$ and 200-mm-diameter wafers $d_2$. Other types of end effectors (which may use mechanical gripping of the wafer instead of vacuum) can be used in other implementations.

Figure 14:
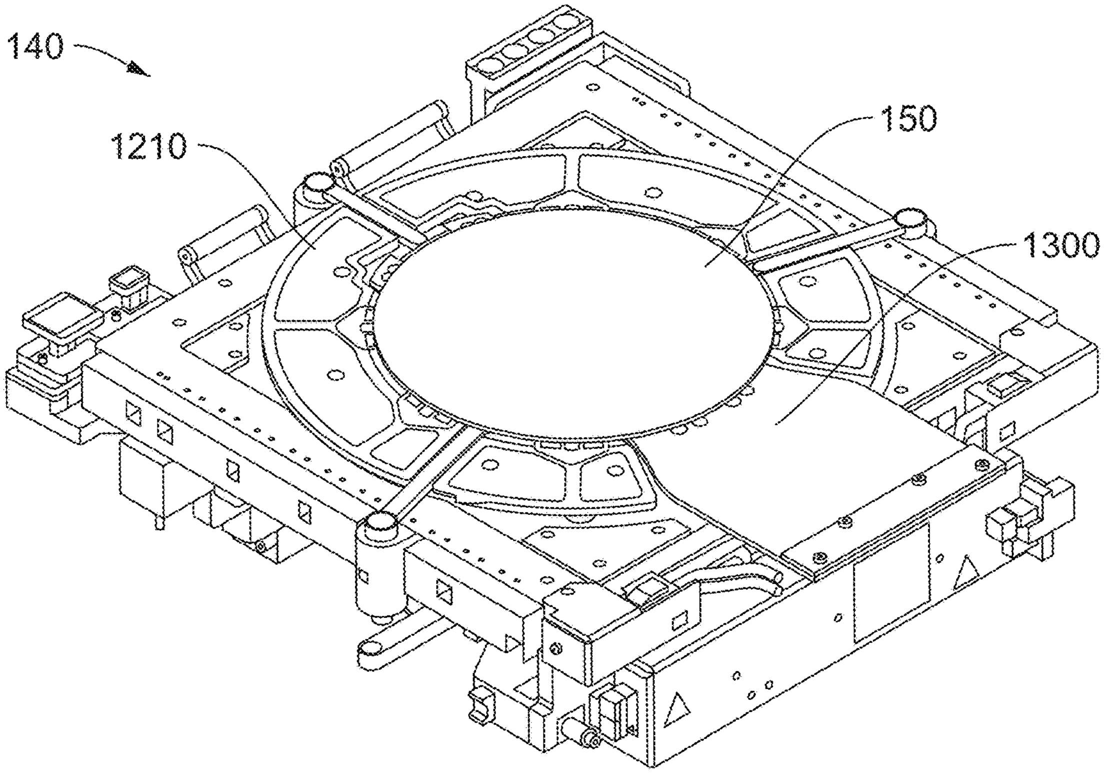
FIG. 14 depicts a semiconductor wafer in a load position on the wafer chuck and adapter of FIG. 12.

FIG. 14 shows the end effector 1300 in a loading position with a semiconductor wafer 150 positioned on the wafer chuck 140. The semiconductor wafer 150 is illustrated in semi-transparent view so that the end effector 1300 can be seen under the wafer. After loading, vacuum is applied at the wafer chuck 140 to grip the semiconductor wafer 150 by the adapter 1210 and vacuum is released from the end effector 1300. The wafer-gripping end effector 1300 can then be removed from under the wafer so that wafer inspection can commence. After inspection, the end effector 1300 is moved under the wafer to grip the wafer again and move it back to a cassette of wafers. The loading and unloading of the semiconductor wafer 150 by the end effector 1300 can be fully automated with robotic apparatus that mechanically couples to the end effector 1300 within the wafer inspection system 100 and operates under the control of the controller 112.

Figure 15:
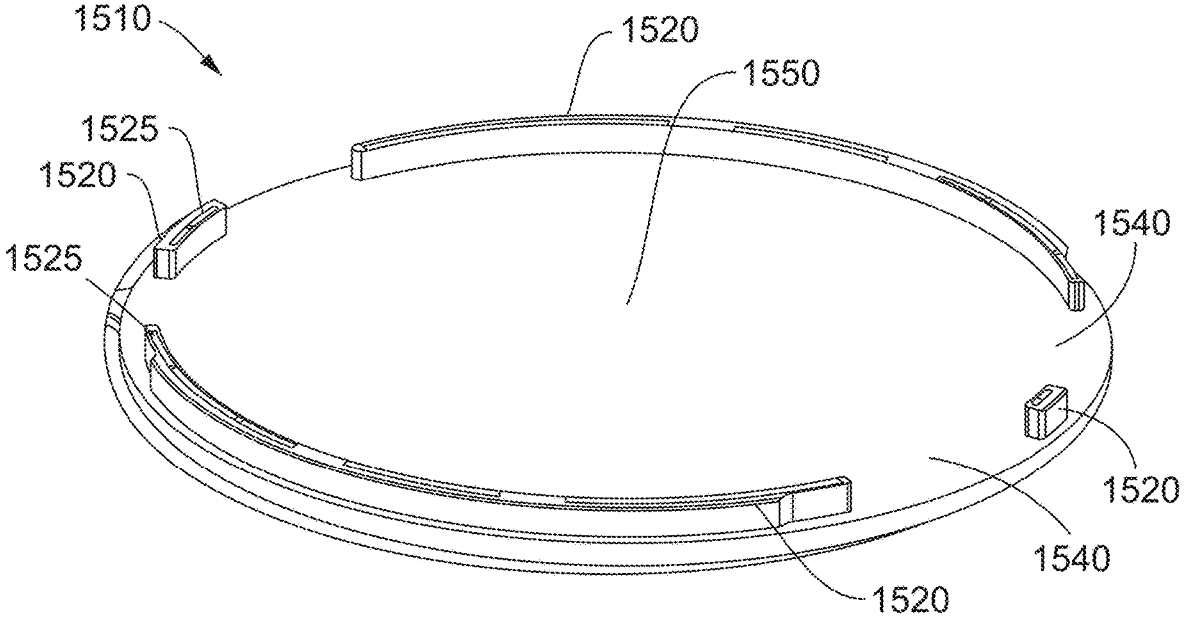
FIG. 15 depicts another example of an adapter.

FIG. 15 illustrates another implementation of an adapter 1510 for a wafer chuck. The adapter 1510 is circular in shape and includes raised features 1520 around at least a portion of the periphery of the adapter. The raised features 1520 can be used to support the semiconductor wafer 150 (not shown) above a surface 1550 of the adapter 1510. The raised features 1520 can include vacuum grooves 1525 to which a vacuum can be applied so as to secure and retain the semiconductor wafer 150 to the raised features 1520 when loading the wafer onto the raised features 1520 and applying a vacuum to the vacuum grooves 1525. The surface 1550 of the adapter can be reflective or a mirror can be mounted thereto. There can be openings 1540 in the raised features 1520 to allow ingress and egress of an end effector for loading and unloading wafers onto the adapter 1510. The adapter 1510 can be formed from and/or comprise a metal (e.g., aluminum, titanium, stainless steel) or a metal alloy comprising at least one of these materials.

6. KIT IMPLEMENTATIONS

Components to adapt a wafer inspection system 100 (such as a semiconductor inspection tool or conventional microscope) to an apparatus that can also detect polarization-altering defects can be provided as a conversion kit. For example, at least one circular polarizer 710, elliptical polarizer, or pair of linear polarizer 210 and quarter-wave plate 220 can be provided to insert into the forward optical path 302 of the inspection system 100 at a location that also intercepts the reflected optical path 304. Alternatively, duplicates of each polarizing component can be provided; one of the copies to be inserted into the forward optical path 302 and one of the copies to be inserted into the reflected optical path 304. One or more rotation mounts can be provided in the kit to mount one or more of the linear polarizer(s) 210 and the quarter-wave plate(s) 220 (e.g., to allow user adjustment of angle(s) between the polarization axis of the linear polarizer(s) 210 and the fast axis of the quarter-wave plate(s) 220. A mirror 230 can also be provided with the conversion kit to mount on the system's wafer chuck 140 or sample-holding stage. In some cases, at least one adapter 1210 can be included in the kit to elevate the wafer above the mirror 230. The adapter 1210 can be configured to hold the mirror within the adapter 1210 and secure the mirror 230 to the wafer chuck 140 or sample-holding stage. For example, the adapter 1210 may include holes for screws 1230 that can attach the adapter to the wafer chuck 140 or sample-holding stage of a conventional microscope. In some cases, a replacement wafer chuck 140 or sample-holding stage can be provided that includes a mounted mirror and at least one adapter for supporting the semiconductor wafer above the mirror 230.

Various configurations of the above-described inspection apparatus and methods associated with the apparatus are possible, some examples of which are listed below.

(1) A system for detecting a polarization-altering defect in a semiconductor wafer, the system comprising: an illumination source to emit radiation; an objective lens to focus the radiation from the illumination source onto the semiconductor wafer; a mirror arranged to reflect the radiation that emerges from the semiconductor wafer back through the semiconductor wafer as reflected radiation; an imaging array to record an image of at least part of the semiconductor wafer produced by at least a portion of the reflected radiation that passes back through the semiconductor wafer; and a linear polarizer located between the semiconductor wafer and the imaging array, wherein the linear polarizer is oriented to: block a first portion of the reflected radiation that travels through a first region of the semiconductor wafer that does not include the polarization-altering defect; and transmit at least part of a second portion of the reflected radiation that travels through a second region of the semiconductor wafer that includes the polarization-altering defect.

(2) The system of configuration (1), wherein the linear polarizer comprises an absorptive polarizer.

(3) The system of configuration (1) or (2), further comprising a wave plate located between the linear polarizer and the semiconductor wafer, wherein the wave plate comprises a birefringent crystal.

(4) The system of configuration (3), wherein the linear polarizer and the wave plate are located between the illumination source and the objective lens.

(5) The system of configuration (3) or (4), wherein a polarization axis of the linear polarizer is oriented at an angle from 35 degrees to 55 degrees with respect to a fast axis of the wave plate.

(6) The system of any one of configurations (3) through (5), further comprising a rotation mount to hold at least one of the linear polarizer and the wave plate such that an angle between a fast axis of the wave plate and a polarization axis of the linear polarizer can be adjusted.

(7) The system of configuration (1) or (2), further comprising a wave plate, wherein the linear polarizer and the wave plate are located between the objective lens and the mirror.

(8) The system of configuration (7), further comprising a rotation mount to hold at least one of the linear polarizer and the wave plate such that an angle between a fast axis of the wave plate and a polarization axis of the linear polarizer can be adjusted.

(9) The system of configuration (1) or (2), further comprising a quarter-wave plate combined with the first linear polarizer to form a circular polarizer.

(10) The system of configuration (9), wherein the circular polarizer is located in the system to intercept a forward optical path extending from the illumination source to the mirror and to further intercept a reflected optical path extending from the mirror to the imaging array.

(11) The system of configuration (1) or (2), further comprising a wave plate combined with the linear polarizer to form an elliptical polarizer.

(12) The system of configuration (11), wherein the elliptical polarizer is located in the system to intercept a forward optical path extending from the illumination source to the mirror and to further intercept a reflected optical path extending from the mirror to the imaging array.

(13) The system of configuration (11) or (12), further comprising a rotation mount to hold the elliptical polarizer such that an angle between a major axis of elliptically polarized radiation output from the elliptical polarizer and a crystallographic axis of the semiconductor wafer can be adjusted.

(14) The system of any one of configurations (1) through (13), wherein the imaging array records the second portion of the reflected radiation transmitted by the linear polarizer as a bright feature on a darker background level, wherein:

the bright feature is representative of the polarization-altering defect;

the bright features has a higher intensity level compared to an intensity level of the background level; and the background level results from the first portion of the reflected radiation that is blocked by the linear polarizer.

(15) The system of configuration (14), wherein the linear polarizer is oriented such that a bright-field image of non-polarization-altering defects in the first region and the second region of the semiconductor wafer is simultaneously recorded with the bright feature.

(16) The system of any one of configurations (1) through (15), further comprising a wafer chuck or an adapter for a wafer chuck to hold the semiconductor wafer and the mirror.

(17) The system of configuration (16), wherein the semiconductor wafer is supported above the mirror in the wafer chuck or adapter, such that a backside of the semiconductor wafer does not contact a surface of the mirror.

(18) The system of any one of configurations (1) through (17), wherein the polarization-altering defect comprises a micropipe.

(19) The system of any one of configurations (1) through (18), wherein the illumination source emits unpolarized radiation having a radiation bandwidth with a central wavelength lying within a range from 350 nm to 3000 nm.

(20) The system of any one of configurations (1) through (19) configured to detect the polarization-altering defect in the semiconductor wafer comprising silicon carbide.

(21) The system of any one of configurations (1) through (20), wherein the system defines: a forward optical path extending from the illumination source to the mirror along which the radiation travels from the illumination source to the mirror; and a reflected optical path extending from the mirror to the imaging array along which the reflected radiation travels from the mirror to the imaging array, wherein the forward optical path and the reflected optical path are collinear through the semiconductor wafer.

(22) A method of detecting a polarization-altering defect in a semiconductor wafer, the method comprising: illuminating, with radiation from an illumination source, an area of a semiconductor wafer with the radiation in a first polarization state; reflecting, with a mirror, the radiation that has passed through the semiconductor wafer back towards the semiconductor wafer as reflected radiation; collecting, with an objective lens, a portion of the reflected radiation to form an image of the area of the semiconductor wafer; blocking, with a linear polarizer, a first portion of the reflected radiation that travels through a first region within the area of the semiconductor wafer that does not include the polarization-altering defect; transmitting, with the linear polarizer, at least part of a second portion of the reflected radiation that travels through a second region within the area of the semiconductor wafer that includes the polarization-altering defect; and detecting, with an imaging array, an image of the area of the semiconductor wafer produced by at least the part of the second portion of the reflected radiation that is transmitted by the linear polarizer.

(23) The method of (22), further comprising converting the radiation from the illumination source into circularly polarized radiation with a circular polarizer for the first polarization state.

(24) The method of (22), further comprising converting the radiation from the illumination source into elliptically polarized radiation with an elliptical polarizer for the first polarization state.

(25) The method of (24), further comprising converting, with the semiconductor wafer, the elliptically polarized radiation to circularly polarized radiation.

(26) The method of (24) or (25), wherein the elliptical polarizer comprises the linear polarizer and a wave plate.

(27) The method of any one of (22) through (26), further comprising converting the radiation from the illumination source into linearly polarized radiation with the linear polarizer for the first polarization state.

(28) The method of any one of (22) through (27), wherein detecting the image comprises forming a bright feature on a background, wherein: the bright feature is formed from the part of the second portion of the reflected radiation transmitted by the linear polarizer; the bright feature is representative of the polarization-altering defect and has a higher intensity level compared to an intensity level of the background; and the background in the image results from blocking the first portion of the reflected radiation with the linear polarizer.

(29) The method of (28), wherein detecting the image further comprises forming dark features representative of non-polarization-altering defects in the image, the dark features having a lower intensity level than the intensity level of the background.

(30) A kit to convert a wafer inspection system into a system to detect polarization-altering defects in a semiconductor wafer, the kit comprising: at least one linear polarizer to mount in a forward optical path of the wafer inspection system, the forward optical path extending between an illumination source and the semiconductor wafer, wherein the illumination source is arranged to illuminate an area of the semiconductor wafer for inspection of the semiconductor wafer; at least one wave plate to mount in the forward optical path between the linear polarizer and the semiconductor wafer; and a mirror to mount in the wafer inspection system at a location such that radiation from the illumination source that travels along the forward optical path and passes through the semiconductor wafer reflects from the mirror back through the semiconductor wafer and towards an objective lens of the wafer inspection system.

(31) The kit of configuration (30), wherein a linear polarizer of the at least one linear polarizer comprises an absorptive polarizer.

(32) The kit of configuration (30) or (31), wherein a wave plate of the at least one wave plate comprises a birefringent crystal.

(33) The kit of any one of configurations (30) through (32), wherein a wave plate of the at least one wave plate comprises a quarter-wave plate.

(34) The kit of configuration (30), wherein a linear polarizer of the at least one linear polarizer and a wave plate of the at least one wave plate are mounted together as a single unit that produces circular polarization from unpolarized light.

(35) The kit of configuration (30), wherein a linear polarizer of the at least one linear polarizer and a wave plate of the at least one wave plate are mounted together as a single unit that produces elliptical polarization from unpolarized light.

(36) The kit of any one of configurations (30) through (35), wherein: the at least one linear polarizer is a single linear polarizer; the at least one wave plate is a single wave plate; the single linear polarizer is configured to be located in the wafer inspection system such that it intercepts a segment of a reflected optical path extending from the semiconductor wafer through the objective lens and to an imaging array of the wafer inspection system; and the single wave plate is also configured to be located in the wafer inspection system such that it intercepts the reflected optical path.

(37) The kit of any one of configurations (30) through (36), further comprising a rotation mount to hold and allow rotation adjustment of at least one of: a linear polarizer of the at least one linear polarizer; and a wave plate of the at least one wave plate in the wafer inspection system.

(38) The kit of any one of configurations (30) through (37), further comprising an adapter for a wafer chuck to hold the semiconductor wafer between the objective lens and the mirror.

(39) The kit of configuration (38), wherein the adapter is configured to hold the semiconductor wafer only at a peripheral region of the semiconductor wafer, the peripheral region comprising an annular ring extending inwards from an edge of the semiconductor wafer no more than 8 mm.

(40) The kit of configuration (38) or (39), wherein the mirror is mounted to or mounted adjacent to the adapter.

(41) The kit of any one of configurations (38) through (40), wherein the adapter has an annular shape at least in part and is configured to hold the semiconductor wafer a distance away from the mirror such that the semiconductor wafer does not contact the mirror.

(42) The kit of any one of configurations (38) through (41), wherein the adapter is sized to hold a semiconductor wafer having a diameter of at least 150 mm.

(43) The kit of any one of configurations (38) through (42), wherein the adapter has a cut-out to allow entry of a wafer-gripping end effector into a central region of the adapter for loading and unloading of the semiconductor wafer.

(44) The kit of any one of configurations (30) through (43), wherein the polarization-altering defects comprise micropipes.

(45) The kit of any one of configurations (30) through (44), wherein the kit adapts the wafer inspection system to detect the polarization-altering defects in a silicon carbide semiconductor wafer.

(46) A method of detecting a polarization-altering defect in a semiconductor wafer with a kit that adapts a wafer inspection system into a system to detect polarization-altering defects in the semiconductor wafer, the method comprising: mounting a linear polarizer in a forward optical path of the wafer inspection system, the forward optical path extending between an illumination source and the semiconductor wafer, wherein the illumination source is arranged to illuminate the semiconductor wafer for inspection of the semiconductor wafer; mounting a wave plate in the forward optical path between the linear polarizer and the semiconductor wafer; and mounting a mirror in the wafer inspection system at a location such that radiation from the illumination source that travels along the forward optical path and passes through the semiconductor wafer reflects from the mirror back through the semiconductor wafer and towards an objective lens of the wafer inspection system.

(47) The method of (46), further comprising: illuminating, with radiation from the illumination source, an area of a semiconductor wafer with the radiation in a first polarization state; reflecting, with the mirror, the radiation that has passed through the semiconductor wafer back towards the semiconductor wafer as reflected radiation; collecting, with the objective lens, a portion of the reflected radiation to form an image of the area of the semiconductor wafer; blocking, with the linear polarizer, a first portion of the reflected radiation that travels through a first region within the area of the semiconductor wafer that does not include the polarization-altering defect; and transmitting, with the linear polarizer, at least part of a second portion of the reflected radiation that travels through a second region within the area of the semiconductor wafer that includes the polarization-altering defect; and detecting, with an imaging array, an image of the area of the semiconductor wafer produced by at least the part of the second portion of the reflected radiation that is transmitted by the linear polarizer.

(48) The method of (47), further comprising converting the radiation from the illumination source into circularly polarized radiation for the first polarization state with the linear polarizer and the wave plate.

(49) The method of (48), wherein the wave plate is a quarter-wave plate formed from a birefringent crystal.

(50) The method of (47), further comprising converting the radiation from the illumination source into elliptically polarized radiation for the first polarization state with the linear polarizer and the wave plate.

(51) The method of (50), further comprising converting, with the semiconductor wafer, the elliptically polarized radiation to circularly polarized radiation that is incident on the mirror.

(52) The method of any one of (46) through (51), wherein the linear polarizer is an absorptive polarizer.

(53) The method of any one of (47) through (52), wherein detecting the image comprises forming a bright feature on a background, wherein: the bright feature is formed from the part of the second portion of the reflected radiation transmitted by the linear polarizer; the bright feature is representative of the polarization-altering defect and has a higher intensity level compared to an intensity level of the background; and the background in the image results from blocking the first portion of the reflected radiation with the linear polarizer.

(54) The method of (53), wherein detecting the image further comprises forming dark features representative of non-polarization-altering defects in the image, the dark features having a lower intensity level than the intensity level of the background.

(55) The method of any one of (46) through (54), wherein mounting the mirror comprises mounting the mirror on a wafer chuck that holds the semiconductor wafer.

(56) The method of (55), wherein mounting the mirror further comprises mounting an adapter to the wafer chuck, wherein the adapter has an annular shape at least in part and is configured to hold the semiconductor wafer a distance away from the mirror such that the semiconductor wafer does not contact the mirror.

(57) The method of (56), wherein the adapter is sized to hold a semiconductor wafer having a diameter of at least 150 mm.

(58) The method of any one of (55) through (57), wherein the adapter has a cut-out to allow entry of a wafer-gripping end effector into a central region of the adapter for loading and unloading of the semiconductor wafer.

7. CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A kit to convert a wafer inspection system into a system to detect polarization-altering defects in a semiconductor wafer, the kit comprising:

at least one linear polarizer to mount in a forward optical path of the wafer inspection system, the forward optical path extending between an illumination source and the semiconductor wafer, wherein the illumination source is arranged to illuminate an area of the semiconductor wafer for inspection of the semiconductor wafer;

at least one wave plate to mount in the forward optical path between the linear polarizer and the semiconductor wafer; and a mirror to mount in the wafer inspection system at a location such that radiation from the illumination source that travels along the forward optical path and passes through the semiconductor wafer reflects from the mirror back through the semiconductor wafer and towards an objective lens of the wafer inspection system.

2. The kit of claim 1, wherein a linear polarizer of the at least one linear polarizer comprises an absorptive polarizer.

3. The kit of claim 1, wherein a wave plate of the at least one wave plate comprises a birefringent crystal.

4. The kit of claim 1, wherein a wave plate of the at least one wave plate comprises a quarter-wave plate.

5. The kit of claim 1, wherein a linear polarizer of the at least one linear polarizer and a wave plate of the at least one wave plate are mounted together as a single unit that produces circular polarization from unpolarized light.

6. The kit of claim 1, wherein a linear polarizer of the at least one linear polarizer and a wave plate of the at least one wave plate are mounted together as a single unit that produces elliptical polarization from unpolarized light.

7. The kit of claim 1, wherein:

the at least one linear polarizer is a single linear polarizer;

the at least one wave plate is a single wave plate;

the single linear polarizer is configured to be located in the wafer inspection system such that it intercepts a segment of a reflected optical path extending from the semiconductor wafer through the objective lens and to an imaging array of the wafer inspection system; and the single wave plate is also configured to be located in the wafer inspection system such that it intercepts the reflected optical path.

8. The kit of claim 1, further comprising a rotation mount to hold and allow rotation adjustment of at least one of:

a linear polarizer of the at least one linear polarizer; and a wave plate of the at least one wave plate in the wafer inspection system.

9. The kit of claim 1, further comprising an adapter for a wafer chuck to hold the semiconductor wafer between the objective lens and the mirror.

10. The kit of claim 9, wherein the adapter is configured to hold the semiconductor wafer only at a peripheral region of the semiconductor wafer, the peripheral region comprising an annular ring extending inwards from an edge of the semiconductor wafer no more than 8 mm.

11. The kit of claim 9, wherein the mirror is mounted to or mounted adjacent to the adapter.

12. The kit of claim 9, wherein the adapter has an annular shape at least in part and is configured to hold the semiconductor wafer a distance away from the mirror such that the semiconductor wafer does not contact the mirror.

13. The kit of claim 12, wherein the adapter is sized to hold a semiconductor wafer having a diameter of at least 150 mm.

14. The kit of claim 12, wherein the adapter has a cut-out to allow entry of a wafer-gripping end effector into a central region of the adapter for loading and unloading of the semiconductor wafer.

15. The kit of claim 1, wherein the polarization-altering defects comprise micropipes.

16. The kit of claim 1, wherein the kit adapts the wafer inspection system to detect the polarization-altering defects in a silicon carbide semiconductor wafer.

17. A method of detecting a polarization-altering defect in a semiconductor wafer with a kit that adapts a wafer inspection system into a system to detect polarization-altering defects in the semiconductor wafer, the method comprising:

mounting a linear polarizer in a forward optical path of the wafer inspection system, the forward optical path extending between an illumination source and the semiconductor wafer, wherein the illumination source is arranged to illuminate the semiconductor wafer for inspection of the semiconductor wafer;

mounting a wave plate in the forward optical path between the linear polarizer and the semiconductor wafer; and mounting a mirror in the wafer inspection system at a location such that radiation from the illumination source that travels along the forward optical path and passes through the semiconductor wafer reflects from the mirror back through the semiconductor wafer and towards an objective lens of the wafer inspection system.

18. The method of claim 17, further comprising:

illuminating, with radiation from the illumination source, an area of a semiconductor wafer with the radiation in a first polarization state;

reflecting, with the mirror, the radiation that has passed through the semiconductor wafer back towards the semiconductor wafer as reflected radiation;

collecting, with the objective lens, a portion of the reflected radiation to form an image of the area of the semiconductor wafer;

blocking, with the linear polarizer, a first portion of the reflected radiation that travels through a first region within the area of the semiconductor wafer that does not include the polarization-altering defect; and transmitting, with the linear polarizer, at least part of a second portion of the reflected radiation that travels through a second region within the area of the semiconductor wafer that includes the polarization-altering defect; and detecting, with an imaging array, an image of the area of the semiconductor wafer produced by at least the part of the second portion of the reflected radiation that is transmitted by the linear polarizer.

19. The method of claim 18, further comprising:

converting the radiation from the illumination source into circularly polarized radiation for the first polarization state with the linear polarizer and the wave plate.

20. The method of claim 19, wherein the wave plate is a quarter-wave plate formed from a birefringent crystal.

21. The method of claim 18, further comprising:

converting the radiation from the illumination source into elliptically polarized radiation for the first polarization state with the linear polarizer and the wave plate.

22. The method of claim 21, further comprising:

converting, with the semiconductor wafer, the elliptically polarized radiation to circularly polarized radiation that is incident on the mirror.

23. The method of claim 21, wherein the linear polarizer is an absorptive polarizer.

24. The method of claim 18, wherein detecting the image comprises forming a bright feature on a background, wherein:

the bright feature is formed from the part of the second portion of the reflected radiation transmitted by the linear polarizer;

the bright feature is representative of the polarization-altering defect and has a higher intensity level compared to an intensity level of the background; and the background in the image results from blocking the first portion of the reflected radiation with the linear polarizer.

25. The method of claim 24, wherein detecting the image further comprises forming dark features representative of non-polarization-altering defects in the image, the dark features having a lower intensity level than the intensity level of the background.

26. The method of claim 17, wherein mounting the mirror comprises mounting the mirror on a wafer chuck that holds the semiconductor wafer.

27. The method of claim 26, wherein mounting the mirror further comprises mounting an adapter to the wafer chuck, wherein the adapter has an annular shape at least in part and is configured to hold the semiconductor wafer a distance away from the mirror such that the semiconductor wafer does not contact the mirror.

28. The method of claim 26, wherein the adapter is sized to hold a semiconductor wafer having a diameter of at least 150 mm.

29. The method of claim 26, wherein the adapter has a cut-out to allow entry of a wafer-gripping end effector into a central region of the adapter for loading and unloading of the semiconductor wafer.

* * * * *